United States Patent
Yasuda et al.

(10) Patent No.: US 11,404,525 B2
(45) Date of Patent: Aug. 2, 2022

(54) DISPLAY DEVICE AND METHOD FOR MANUFACTURING DISPLAY DEVICE

(71) Applicant: SHARP KABUSHIKI KAISHA, Sakai (JP)

(72) Inventors: Yuki Yasuda, Sakai (JP); Katsuyuki Suga, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 180 days.

(21) Appl. No.: 16/976,716

(22) PCT Filed: Mar. 1, 2018

(86) PCT No.: PCT/JP2018/007870
§ 371 (c)(1),
(2) Date: Aug. 28, 2020

(87) PCT Pub. No.: WO2019/167239
PCT Pub. Date: Sep. 6, 2019

(65) Prior Publication Data
US 2020/0411626 A1   Dec. 31, 2020

(51) Int. Cl.
*H01L 27/32* (2006.01)
*H01L 51/00* (2006.01)
*H01L 51/56* (2006.01)

(52) U.S. Cl.
CPC ...... *H01L 27/3276* (2013.01); *H01L 51/0097* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| 2014/0353670 | A1  | 12/2014 | Youn et al. |
| 2015/0287750 | A1* | 10/2015 | Youn ............... H01L 51/0097 438/586 |
| 2017/0288007 | A1* | 10/2017 | Shin ............... H01L 51/0097 |
| 2022/0113760 | A1* | 4/2022  | Rhe ................ H01L 27/3276 |

FOREIGN PATENT DOCUMENTS

JP   2014-232300 A   12/2014

* cited by examiner

*Primary Examiner* — J. E. Schoenholtz
(74) *Attorney, Agent, or Firm* — ScienBiziP, P.C.

(57) ABSTRACT

A terminal of a flexible organic EL display device is formed using a third conductive member being a second metal layer exposed through an opening of a second resin layer. In the opening of the second resin layer, a protruding portion being formed using a third resin layer being a layer lower than the second resin layer and the third conductive member being the second metal layer overlap each other.

19 Claims, 10 Drawing Sheets

DISPLAY DEVICE AND METHOD FOR MANUFACTURING DISPLAY DEVICE

TECHNICAL FIELD

The disclosure relates to a display device and a method for manufacturing the display device.

BACKGROUND ART

PTL 1 discloses a display device including terminals (pads) for supplying signals from the outside.

CITATION LIST

Patent Literature

PTL 1: JP 2014-232300 A (published on Dec. 11, 2014)

SUMMARY

Technical Problem

In a known display device disclosed in PTL 1, terminals (pads) are formed on a protection film having a large film thickness. For this configuration, the terminals (pads) are formed by using a layer for forming pixel electrodes (also referred to as a layer for forming a cathode electrode or an anode electrode) as an upper layer of the protection film, which is a layer covering transistor elements (TFT elements) provided in the display device.

However, when the layer for forming the pixel electrodes (layer for forming a cathode electrode or an anode electrode) is used, a conductive material such as Indium Tin Oxide (ITO) and Indium Zinc Oxide (IZO) is generally contained. The layer for forming the pixel electrodes thus has lower strength than, for example, a metal layer for forming a source electrode and a drain electrode in the transistor elements (TFT elements) provided in the display device. Such circumstances present a problem of easily causing damage to the terminals (pads) formed by using the layer for forming the pixel electrodes (layer for forming a cathode electrode or an anode electrode), when an electronic circuit board is mounted on the terminals.

The disclosure is made in view of the problem described above, and has an object to provide a display device and a manufacturing method for the display device that, when an electronic circuit board is mounted on terminals (pads), allow for suppression of damage to the terminals and allow the electronic circuit board to be easily mounted on the terminals.

Solution to Problem

To solve the problem described above, a display device according to the disclosure is a display device including: a substrate; a display element defining a display region being provided above the substrate so that the display element and the substrate interpose a TFT layer; a frame region being provided around the display region; and a terminal being provided at an end portion of the frame region and being configured to input a signal from outside, wherein the TFT layer includes, sequentially from a side of the substrate, a first inorganic layer, a first metal layer, a second inorganic layer, a second metal layer, and a first resin layer, a lead wiring line being configured to transmit the signal from the terminal to a signal line in the display region is formed in a part of the frame region between the display region and the terminal, the lead wiring line being formed using the first metal layer, the terminal is formed using the second metal layer exposed through an opening of a second resin layer, in the opening of the second resin layer, a protruding portion being formed using a third resin layer being a layer lower than the second resin layer and the second metal layer overlap each other, and the lead wiring line and the second metal layer are electrically connected through a contact hole being formed in the second inorganic layer.

According to the configuration, the terminal is formed using the second metal layer exposed through the opening of the second resin layer. Further, in the opening of the second resin layer, the protruding portion being formed using the third resin layer being the layer lower than the second resin layer and the second metal layer overlap each other. The configuration ensures implementation of the display device that, when an electronic circuit board is mounted on the terminal, allows for suppression of damage to the terminal and allows the electronic circuit board to be easily mounted on the terminal.

To solve the problem described above, a manufacturing method for a display device according to the disclosure is a manufacturing method for a display device including a substrate, a display element defining a display region being provided above the substrate so that the display element and the substrate interpose a TFT layer, a frame region being provided around the display region, and a terminal being provided at an end portion of the frame region and being configured to input a signal from outside, the manufacturing method including the steps of: forming the TFT layer, the forming the TFT layer including forming a first inorganic layer, forming a first metal layer, forming a second inorganic layer, forming a second metal layer, and forming a first resin layer; forming a second resin layer; and forming a third resin layer, wherein, in the forming of the first inorganic layer, the first inorganic layer is formed on the substrate, in the forming of the first metal layer, a lead wiring line being configured to transmit the signal from the terminal to a signal line in the display region is formed on the first inorganic layer in a part of the frame region between the display region and the terminal, in the forming of the second inorganic layer, the second inorganic layer is formed to cover the lead wiring line, and a contact hole is then formed at a portion of the second inorganic layer to overlap the lead wiring line, in the forming of the third resin layer, a protruding portion is formed on the second inorganic layer, in the forming of the second metal layer, the second metal layer is formed to overlap the protruding portion and to be electrically connected to the lead wiring line through the contact hole, and in the forming of the second resin layer, an opening is formed at a position at which the protruding portion and the second metal layer overlap each other.

According to the method, the terminal is formed using the second metal layer exposed through the opening of the second resin layer. Further, in the opening of the second resin layer, the protruding portion being formed using the third resin layer being the layer lower than the second resin layer and the second metal layer overlap each other. The method ensures implementation of the manufacturing method for the display device that, when an electronic circuit board is mounted on the terminal, allows for suppression of damage to the terminal and allows the electronic circuit board to be easily mounted on the terminal.

Advantageous Effects of Disclosure

An aspect of the disclosure enables the provision of the display device and the manufacturing method for the display device that, when an electronic circuit board is mounted on the terminal, allow for suppression of damage to the terminal and allow the electronic circuit board to be easily mounted on the terminal.

DESCRIPTION OF EMBODIMENTS

Figure 1:
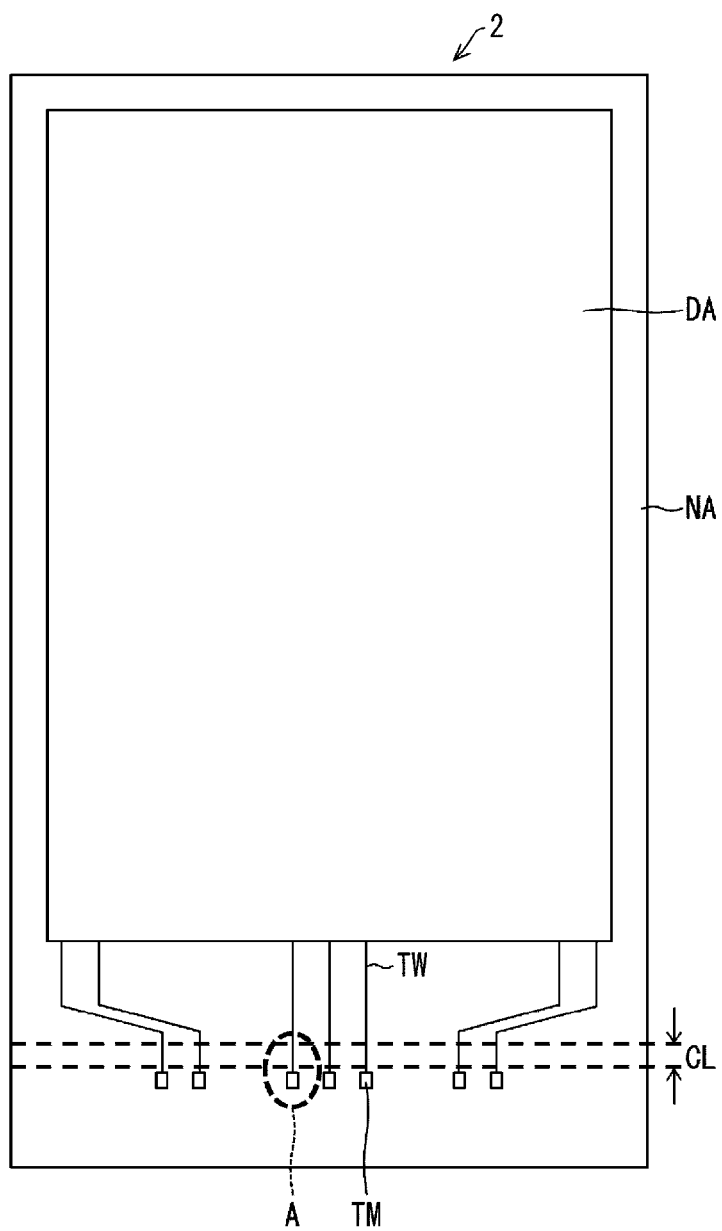
FIG. 1 is a plan view illustrating a configuration example of a flexible organic EL display device according to the first embodiment.

A description follows regarding embodiments of the disclosure, with reference to FIGS. 1 to 10. Hereinafter, for convenience of description, components having the same functions as those described in a specific embodiment are denoted by the same reference numerals, and descriptions thereof may be omitted.

Note that, in the following embodiments, description is made of an organic electro luminescence (EL) element as an example of a display element (optical element). However, the embodiment is not limited thereto, and may be, for example, a reflective-type liquid crystal display element, in which luminance and transmittance are controlled by a voltage and backlight is not required.

The display element (optical element) may be an optical element whose luminance and transmittance are controlled by an electric current, and examples of the electric current-controlled optical element include an organic electro luminescence (EL) display provided with an organic light emitting diode (OLED), an EL display such as an inorganic EL display provided with an inorganic light emitting diode, or a quantum dot light emitting diode (QLED) display provided with a QLED.

First Embodiment

Figure 2:
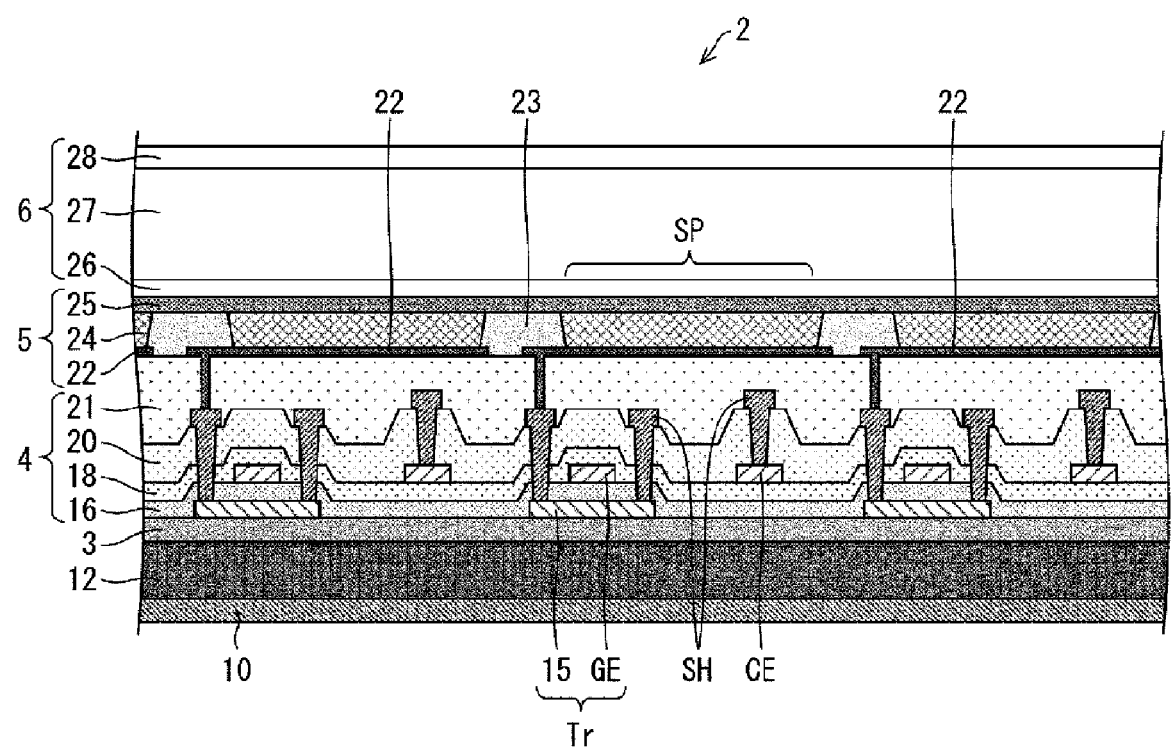
FIG. 2 is a cross-sectional view illustrating a configuration example of a display region of the flexible organic EL display device according to the first embodiment.
Figure 3:
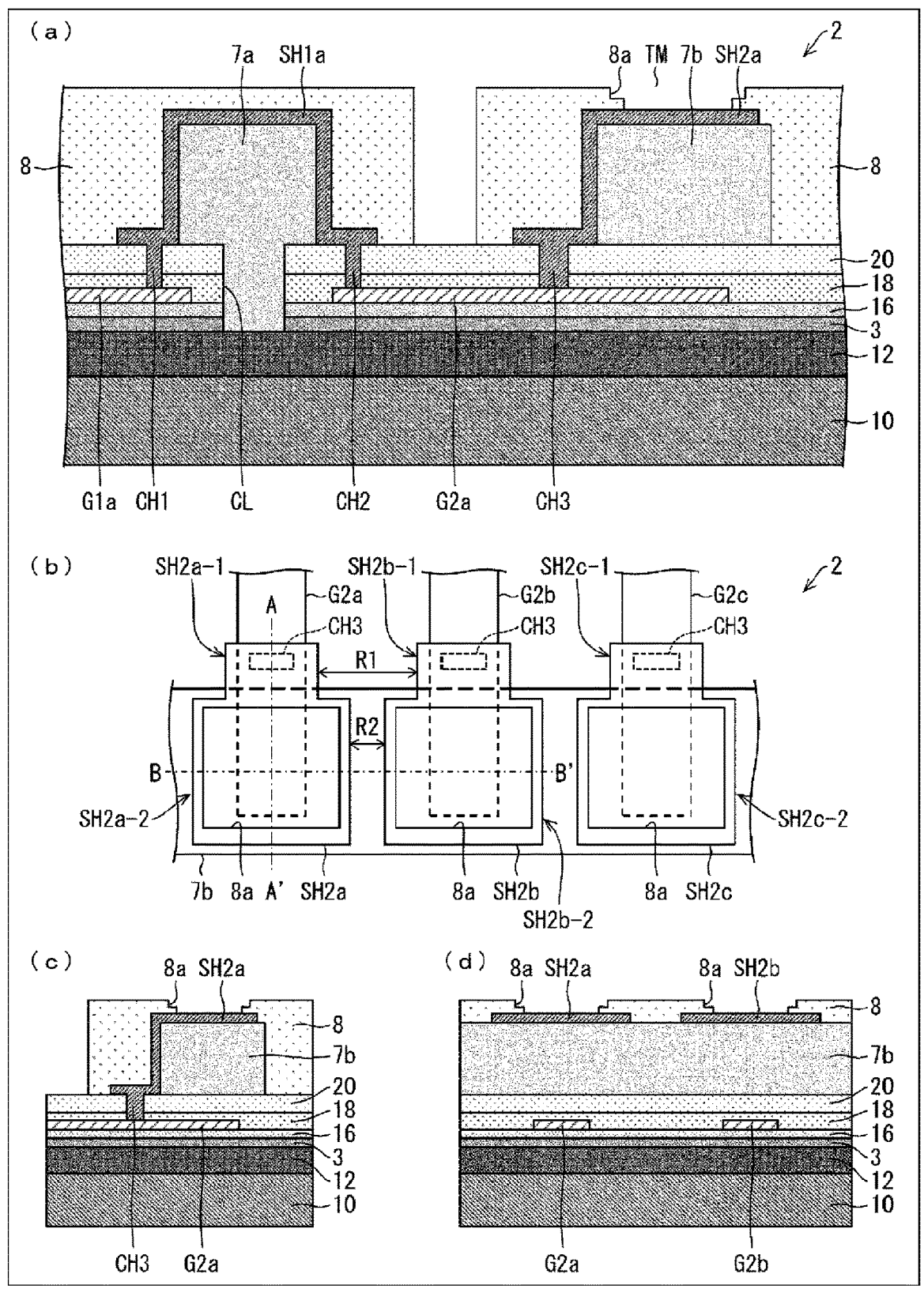
FIG. 3(a) is a cross-sectional view illustrating the part A of the flexible organic EL display device according to the first embodiment illustrated in FIG. 1.
FIG. 3(b) is a plan view around terminals of the flexible organic EL display device according to the first embodiment.
FIG. 3(c) is a cross-sectional view of the flexible organic EL display device according to the first embodiment illustrated in FIG. 3(b), which is taken along the line A-A'.
FIG. 3(d) is a cross-sectional view of the flexible organic EL display device according to the first embodiment illustrated in FIG. 3(b), which is taken along the line B-B'.

With reference to FIG. 1 to FIG. 3, a flexible organic EL display device 2 according to the first embodiment of the disclosure will be described below.

FIG. 1 is a plan view illustrating a configuration example of the flexible organic EL display device 2.

FIG. 2 is a cross-sectional view illustrating a configuration example of a display region DA of the flexible organic EL display device 2.

A process of manufacturing the flexible organic EL display device 2 will be described with reference to FIG. 2.

First, a resin layer 12 is formed above a transparent support substrate (for example, a mother glass substrate) that is removed and replaced with a lower face film 10 in a later process (step S1). Next, a barrier layer 3 is formed (step S2). Next, a TFT layer 4 including terminals TM and wiring lines TW (see FIG. 1) is formed (step S3). Next, an organic EL element layer 5, i.e., a light-emitting element layer, is formed as a display element (step S4). Next, a sealing layer 6 is formed (step S5). Next, an upper face film (not illustrated) is bonded onto the sealing layer 6 (step S6). Note that it goes without saying that the step of bonding the upper face film (not illustrated) onto the sealing layer 6 can be omitted as appropriate when, for example, a touch panel is provided on the sealing layer 6 by using an adhesive layer. Next, the resin layer 12 is irradiated with laser light through the support substrate to reduce a bonding force between the support substrate and the resin layer 12, and the support substrate is peeled from the resin layer 12 (step S7). This step is also referred to as a Laser Lift Off process (LLO process). Next, the lower face film 10 is bonded to the face of the resin layer 12 from which the support substrate was peeled off with an adhesive layer (not illustrated) therebetween (step S8). Next, a layered body including the lower face film 10, the resin layer 12, the barrier layer 3, the TFT layer 4, the organic EL element layer 5, the sealing layer 6, and the upper face film is divided and a plurality of individual pieces are obtained (step S9). Next, an electronic circuit board (for example, an IC chip) is bonded and mounted on terminals TM with pressure at an edge portion using an Anisotropic Conductive Film (ACF) (step S10). Next, edge folding processing (processing of performing bending at a bending slit CL illustrated in FIG. 1 at a 180-degree) is performed to make a flexible organic EL display device 2 (step S11). Next, an inspection for wire breaking is performed, and in a case where there is breaking of any wire, correction is performed (step S12).

Examples of the material of the resin layer 12 include a polyimide resin, an epoxy resin, and a polyamide resin, but are not limited thereto.

Examples of the material of the lower face film 10 include polyethylene terephthalate (PET), but are not limited thereto.

The barrier layer 3 is a layer that inhibits moisture or impurities from reaching the TFT layer 4 and the organic EL element layer 5 when the flexible organic EL display device 2 is in use, and may consist of, for example, a silicon oxide film, a silicon nitride film, or a silicon oxynitride film, or of a layered film of these films, each of which is formed by means of chemical vapor deposition (CVD).

The TFT layer 4 is provided on a layer above the resin layer 12 and the barrier layer 3. The TFT layer 4 includes a semiconductor film 15, an inorganic insulating film 16 (a gate insulating film) as an upper layer of the semiconductor film 15, a gate electrode GE as an upper layer of the inorganic insulating film 16, an inorganic insulating film 18 as an upper layer of the gate electrode GE, a capacitance wiring line CE as an upper layer of the inorganic insulating film 18, an inorganic insulating film 20 as an upper layer of the capacitance wiring line CE, a source-drain wiring line SH including a source-drain electrode and terminals TM as an upper layer of the inorganic insulating film 20, and a flattening film 21 as an upper layer of the source-drain wiring line SH and the terminals TM.

Specifically, the TFT layer 4 includes, sequentially from the lower face film 10 (substrate) side, the inorganic insulating film 16 as a first inorganic layer, the gate electrode GE as a first metal layer, the inorganic insulating film 18 and/or the inorganic insulating film 20 as a second inorganic layer, the source-drain wiring line SH including a source-drain electrode and the terminals TM as a second metal layer, and the flattening film 21 as a first resin layer.

A thin film transistor Tr (TFT) as an active element is configured so as to include the semiconductor film 15, the inorganic insulating film 16 (gate insulating film), the gate electrode GE, the inorganic insulating film 18, the inorganic insulating film 20, and the source-drain wiring line SH.

Note that, in the flexible organic EL display device 2, a common multi-layer inorganic film is formed at least in the display region DA and a partial region of a frame region NA. The common multi-layer inorganic film includes the barrier layer 3, the inorganic insulating film 16 (gate insulating film), the inorganic insulating film 18, and the inorganic insulating film 20. Specifically, in the display region DA and the partial region of the frame region NA, an inorganic layered film including the inorganic insulating film 16 as the first inorganic layer and the inorganic insulating film 18 and/or the inorganic insulating film 20 as the second inorganic layer is formed.

In the frame region NA disposed outside of the display region DA of the flexible organic EL display device 2 illustrated in FIG. 1, the terminals TM used for establishing connection with an electronic circuit board such as an IC chip and an FPC and the wiring lines TW for connecting the terminals TM and signal lines of the display region DA to each other are formed. The terminals TM are provided at an end portion of the frame region NA. Signals input from the terminals TM are transmitted through the wiring lines TW to signal lines (not illustrated) being wiring lines of the display region DA.

The semiconductor film 15 is formed of low-temperature polysilicon (LTPS) or an oxide semiconductor, for example.

Note that, although the TFT provided with the semiconductor film 15 as the channel is illustrated as having a top gate structure in FIG. 2, the TFT may have a bottom gate structure (when the TFT channel is an oxide semiconductor, for example).

Each of the gate electrodes GE, the capacitance electrodes CE, the source-drain wiring line SH, the wiring lines TW, and the terminals TM is formed of, for example, a monolayer film or a layered film of metal containing at least one of aluminum (Al), tungsten (W), molybdenum (Mo), tantalum (Ta), chromium (Cr), titanium (Ti), and copper (Cu).

The inorganic insulating films 16, 18, 20 may be, for example, formed of a silicon oxide (SiOx) film, a silicon nitride (SiNx) film, or a silicon oxynitride film, or of a layered film of these, each of which is formed by means of the CVD method.

The flattening film (interlayer insulating film) 21 may be formed, for example, of a coatable photosensitive organic material, such as a polyimide resin and an acrylic resin.

The organic EL element layer 5 includes an anode 22 as an upper layer of the flattening film 21, a bank 23 that covers an edge of the anode 22, an electroluminescence (EL) layer 24 as an upper layer of the anode 22, and a cathode 25 as an upper layer of the EL layer 24. For each of subpixels SP, the organic EL element layer 5 includes the anode 22 having an island shape, the EL layer 24, and the cathode 25. The bank 23 (anode edge cover) 23 can be formed of a coatable photosensitive organic material, such as a polyimide resin or an acrylic resin, for example. The organic EL element layer 5 forms the display region DA and is provided on a layer above the TFT layer 4.

For example, the EL layer 24 is formed by layering a hole injection layer, a hole transport layer, a light-emitting layer, an electron transport layer, and an electron injection layer in this order, from the lower layer side. The light-emitting layer is formed in an island shape for each subpixel by a vapor deposition method or ink-jet method, and the other layers, by contrast, may be a solid-like common layer. A configuration is also possible in which one or more layers are not formed, out of the hole injection layer, the hole transport layer, the electron transport layer, and the electron injection layer.

The anode (anode electrode) 22 is photoreflective and is formed by layering Indium Tin Oxide (ITO) and an alloy containing Ag, for example. The cathode 25 may be formed of a transparent conductive material such as Indium Tin Oxide (ITO) or Indium Zinc Oxide (IZO).

Holes and electrons are recombined in the EL layer 24 by a driving current between the anode 22 and the cathode 25 in the organic EL element layer 5, and the excitons generated thereby fall to the ground state such that light is emitted. Since the cathode 25 is transparent and the anode 22 has light reflectivity, the light emitted from the EL layer 24 travels upward and becomes top-emitting.

The sealing layer 6 is transparent, and includes a first inorganic sealing film 26 that covers the cathode 25, an organic sealing film 27 that is formed on the first inorganic sealing film 26, and a second inorganic sealing film 28 that covers the organic sealing film 27. The sealing layer 6 covering the organic EL element layer 5 inhibits foreign matter, such as water and oxygen, from penetrating to the organic EL element layer 5.

Each of the first inorganic sealing film 26 and the second inorganic sealing film 28 may be formed of, for example, a silicon oxide film, a silicon nitride film, or a silicon oxynitride film, or of a layered film of these, each of which is formed by means of CVD. The organic sealing film 27 is a transparent organic film that is thicker than each of the first inorganic sealing film 26 and the second inorganic sealing film 28, and can be formed of a coatable photosensitive organic material such as a polyimide resin or an acrylic resin.

As in the above, the present embodiment has provided description by taking an example of a case in which the flexible organic EL display device 2 is manufactured by a manufacturing process including an LLO process. However, this is not restrictive. For example, when a flexible substrate with high heat resistance capable of withstanding the heat of the process from step S1 to step S5 described above is used as a support substrate, the substrate does not need to be replaced. Thus, step S7 and step S8 described above can be omitted.

(a) of FIG. 3 is a cross-sectional view illustrating the part A of the flexible organic EL display device 2 illustrated in FIG. 1. (b) of FIG. 3 is a plan view around the terminals TM of the flexible organic EL display device 2. (c) of FIG. 3 is a cross-sectional view of the flexible organic EL display device 2 according to the first embodiment illustrated in (b) of FIG. 3, which is taken along the line A-A'. (d) of FIG. 3 is a cross-sectional view of the flexible organic EL display device 2 according to the first embodiment illustrated in (b) of FIG. 3, which is taken along the line B-B'.

The flexible organic EL display device 2 has a configuration of including the display region DA (see FIG. 2) that includes the TFT layer 4 including the thin film transistor Tr (TFT) and the organic EL element layer 5 on the resin layer 12 and the barrier layer 3 provided in the lower face film 10, and the frame region NA illustrated in (a) of FIG. 3 that is provided around the display region DA.

(a) of FIG. 3 illustrates the partial region of the frame region NA provided around the display region DA. In the partial region of the frame region NA, the plurality of terminals TM and the bending slit CL are formed.

In the flexible organic EL display device 2, the barrier layer 3, the inorganic insulating film 16, the inorganic insulating film 18, and the inorganic insulating film 20 are formed as a common multi-layer inorganic film at least in the display region DA and the partial region of the frame region NA.

Each of the plurality of terminals TM is a part of a corresponding one of the plurality of wiring lines TW that input signals from the outside into a part of the plurality of thin film transistors Tr (TFT) illustrated in FIG. 2. Each of the plurality of terminals TM may be a part of a corresponding one of the plurality of wiring lines TW, which is formed to be slightly thicker than other parts.

As illustrated in (a) of FIG. 3, each of the plurality of terminals TM is a part of a corresponding one of the plurality of wiring lines TW that is exposed through an opening 8a of the second resin layer 8.

In the present embodiment, each of the plurality of wiring lines TW includes a fourth conductive member G1a and a lead wiring line G2a that are formed using the same material as the gate electrode GE being the first metal layer, and a first conductive member SH1a and a third conductive member SH2a that are formed using the same material as the source-drain wiring line SH including a source-drain electrode being the second metal layer.

Each of the plurality of terminals TM consists of the third conductive member SH2a being the second metal layer that is exposed through the opening 8a of the second resin layer 8.

In the opening 8a of the second resin layer 8, a protruding portion 7b that is formed using a third resin layer being a layer lower than the second resin layer 8 and the third conductive member SH2a being the second metal layer overlap each other on the inorganic layered film consisting of the barrier layer 3, the inorganic insulating film 16, the inorganic insulating film 18, and the inorganic insulating film 20.

The lead wiring line G2a and the third conductive member SH2a being the second metal layer are electrically connected through a third contact hole CH3 that is formed in the inorganic insulating film 18 and the inorganic insulating film 20 as the second inorganic layer.

Further, in the present embodiment, as illustrated in FIG. 1, the bending slit CL is formed as a single opening that is formed in the partial region of the frame region NA from one end portion to another end portion in a second direction (horizontal direction in the figure) that is orthogonal to a first direction (vertical direction in the figure) being an extension direction of each of the plurality of wiring lines TW. However, this is not restrictive.

Note that, in the present embodiment, as illustrated in (a) of FIG. 3, the bending slit CL is formed by removing the entire inorganic layered film consisting of the barrier layer 3, the inorganic insulating film 16, the inorganic insulating film 18, and the inorganic insulating film 20. However, this is not restrictive, and the bending slit CL may be formed by removing at least a part of the inorganic layered film consisting of the barrier layer 3, the inorganic insulating film 16, the inorganic insulating film 18, and the inorganic insulating film 20.

The process of forming the bending slit CL is performed after the process of forming the inorganic layered film consisting of the barrier layer 3, the inorganic insulating film 16, the inorganic insulating film 18, and the inorganic insulating film 20 and before the process of forming the protruding portion 7b by using the third resin layer, and is a process of forming the bending slit CL by removing at least a part of the inorganic layered film consisting of the barrier layer 3, the inorganic insulating film 16, the inorganic insulating film 18, and the inorganic insulating film 20 by dry etching, for example.

In the present embodiment, the bending slit CL is filled by the third resin layer 7a being the same layer as the protruding portion 7b. The third resin layer 7a as a layer to fill the bending slit and the protruding portion 7b for forming each of the plurality of terminals TM are formed using the same material, and are, for example, simultaneously formed into respective predetermined shapes through a single process by applying a coatable photosensitive organic material such as a polyimide resin and an acrylic resin and then performing light exposure and development. However, this is not restrictive, and the third resin layer 7a and the protruding portion 7b may be formed at different timings through different processes by using different materials.

Note that, in the present embodiment, the third resin layer 7a and the protruding portion 7b are formed through a single process by using the same material, and the height of each of the third resin layer 7a and the protruding portion 7b is thus formed to be the same. However, this is not restrictive, and even when a single process using the same material is performed, the height of each of the third resin layer 7a and the protruding portion 7b can be formed to be different with the use of a halftone mask. Alternatively, when different processes using different materials are performed, the height of each of the third resin layer 7a and the protruding portion 7b can be formed to be different by adopting different light exposure values.

In the present embodiment, the fourth conductive member G1a formed on the display region DA side (left side in the figure) with respect to the bending slit CL and the first conductive member SH1a are electrically connected through a first contact hole CH1 that is formed in the inorganic insulating film 18 and the inorganic insulating film 20, and the lead wiring line G2a formed on the terminal TM side (right side in the figure) with respect to the bending slit CL and the first conductive member SH1a are electrically connected through a second contact hole CH2 that is formed in the inorganic insulating film 18 and the inorganic insulating film 20.

As the second resin layer 8, for example, a coatable photosensitive organic material such as a polyimide resin and an acrylic resin can be used.

In the present embodiment, the flattening film 21 as the first resin layer and the second resin layer 8 are formed by using the same material, and can thus be formed through the same process. However, this is not restrictive.

Further, the present embodiment provides description by taking an example of a case in which the third resin layer 7a as the layer to fill the bending slit and the protruding portion 7b are formed only in the frame region NA. However, the third resin layer 7a and the layer for forming the protruding portion 7b may be formed in the display region DA. In this case, the third resin layer is formed between the source-drain wiring line SH including a source-drain electrode as the second metal layer and the flattening film 21 as the first resin layer of the TFT layer 4.

As illustrated in (a) of FIG. 3, the present embodiment provides description by taking an example of a case in which the second resin layer 8 is divided. However, this is not restrictive. The second resin layer 8 may be one continuous layer.

Note that (a) of FIG. 3 illustrates a configuration in which side surfaces of each of the third resin layer 7a and the protruding portion 7b are formed substantially at a right angle. In actuality, however, since the first conductive member SH1a and the third conductive member SH2a are formed without disconnection, the side surfaces of each of the third resin layer 7a and the protruding portion 7b are formed at a tapered angle smaller than 90 degrees.

As illustrated in (b) of FIG. 3, (c) of FIG. 3, and (d) of FIG. 3, in the present embodiment, the protruding portion 7b is formed as a single layer having an island shape in which the protruding portion 7b has a larger width in the second direction (horizontal direction in (b) of FIG. 3) than the width in the first direction (vertical direction in (b) of FIG. 3) being the extension direction of each of the plurality of wiring lines TW. The second direction is orthogonal to the first direction.

The terminals TM in third conductive members SH2a, SH2b, SH2c . . . respectively electrically connected to lead wiring lines G2a, G2b, G2c . . . share the protruding portion 7b being a single layer having an island shape.

As illustrated in (b) of FIG. 3, the third conductive members SH2a, SH2b, SH2c . . . being the second metal layer respectively include large-width regions SH2a-2, SH2b-2, SH2c-2 . . . each including a portion exposed through the opening 8a of the second resin layer 8 and small-width regions SH2a-1, SH2b-1, SH2c-1 . . . that extend from the respective large-width regions to the display region DA side and include a portion to be electrically connected to the respective lead wiring lines G2a, G2b, G2c . . . .

In a direction perpendicular to an extension direction of the lead wiring lines G2a, G2b, G2c . . . , an interval R1 between adjacent ones of the small-width regions SH2a-1, SH2b-1, SH2c-1 . . . of the third conductive members SH2a, SH2b, SH2c . . . being the second metal layer is larger than an interval R2 of adjacent ones of the large-width regions SH2a-2, SH2b-2, SH2c-2 . . . of the third conductive members SH2a, SH2b, SH2c . . . being the second metal layer.

Further, as illustrated in (b) of FIG. 3, (c) of FIG. 3, and (d) of FIG. 3, the entire regions of the large-width regions SH2a-2, SH2b-2, SH2c-2 . . . of the third conductive members SH2a, SH2b, SH2c . . . being the second metal layer overlap the protruding portion 7b.

As described above, in the flexible organic EL display device 2, the plurality of terminals TM and the protruding portion 7b are disposed in a linear shape in the direction perpendicular to the extension direction of the lead wiring lines G2a, G2b, G2c . . . , in consideration of the fact that a residue is liable to be left at the time of patterning of the second metal layer. Further, one end portion of the protruding portion 7b is disposed at a portion (interval R1) between adjacent ones of the small-width regions SH2a-1, SH2b-1, SH2c-1 . . . of the third conductive members SH2a, SH2b, SH2c . . . . Accordingly, generation of a residue in the protruding portion 7b can be suppressed at the time of patterning of the second metal layer.

Note that the end portion of the protruding portion 7b may be disposed at a portion (interval R2) between adjacent ones of the large-width regions SH2a-2, SH2b-2, SH2c-2 . . . of the third conductive members SH2a, SH2b, SH2c . . . . This configuration, however, is liable to cause generation of a residue in the protruding portion 7b by reason of the narrow interval, and is thus liable to cause leakage between adjacent ones of the third conductive members SH2a, SH2b, SH2c . . . .

Note that the present embodiment has provided description of a case in which each of the plurality of wiring lines TW is formed using the same material as the metal material used to form the gate electrode GE in the thin film transistor Tr illustrated in FIG. 2 and the same material as the metal material used to form the source-drain wiring line SH in the thin film transistor Tr illustrated in FIG. 2, by taking an example in which the fourth conductive member G1a and the lead wiring line G2a are formed using the same material as the metal material used to form the gate electrode GE in the thin film transistor Tr illustrated in FIG. 2, and the first conductive member SH1a and the third conductive member SH2a are formed using the same material as the metal material used to form the source-drain wiring line SH in the thin film transistor Tr illustrated in FIG. 2. However, this is not restrictive. For each of the plurality of wiring lines TW, the same material as the metal material used to form the capacitance wiring line CE included in a capacitance element illustrated in FIG. 2 may be used.

As described above, in the flexible organic EL display device 2, the plurality of terminals TM are formed using the same material as the metal material used to form the source-drain wiring line SH in the thin film transistor Tr illustrated in FIG. 2, and the protruding portion 7b formed using the third resin layer being a layer lower than the second resin layer 8 and the third conductive members SH2a, SH2b, SH2c . . . being the second metal layer overlap each other in the opening 8a of the second resin layer 8. Accordingly, damage to the terminals TM can be suppressed when an electronic circuit board is mounted on the terminals TM. Further, the plurality of terminals TM are formed on the protruding portion 7b, and can thus be disposed at high positions. This configuration allows the electronic circuit board to be easily mounted on the terminals TM.

Note that the present embodiment has provided description by taking an example of the flexible organic EL display device 2 that includes the bending slit CL. However, the present embodiment need not necessarily include the bending slit CL or need not necessarily be applied to a flexible display device (flexible display device). Also when the present embodiment is applied to a non-flexible display device (non-flexible display device), damage to the terminals TM can be suppressed when an electronic circuit board is mounted on the terminals TM, on the condition that the plurality of terminals TM are formed using the same material as the metal material used to form the source-drain wiring line SH in the thin film transistor Tr illustrated in FIG. 2 and the protruding portion 7*b* formed using the third resin layer being a layer lower than the second resin layer 8 and the third conductive members SH2*a*, SH2*b*, SH2*c* . . . being the second metal layer overlap each other in the opening 8*a* of the second resin layer 8. Further, the plurality of terminals TM are formed on the protruding portion 7*b*, and can thus be disposed at high positions. This configuration allows the electronic circuit board to be easily mounted on the terminals TM.

Second Embodiment

Next, with reference to FIG. 4, the second embodiment of the disclosure will be described. A flexible organic EL display device 2' according to the present embodiment is different from the first embodiment in the following respects: In the flexible organic EL display device 2', protruding portions 7*e*1, 7*e*2, 7*e*3 . . . are formed into a plurality of protruding portions each having an island shape so that one protruding portion is provided for a corresponding one of the plurality of terminals. Other configurations are the same as those described in the first embodiment. For convenience of description, members having the same functions as those of the members illustrated in the drawings in the first embodiment are denoted by the same reference numerals, and descriptions thereof will be omitted.

Figure 4:
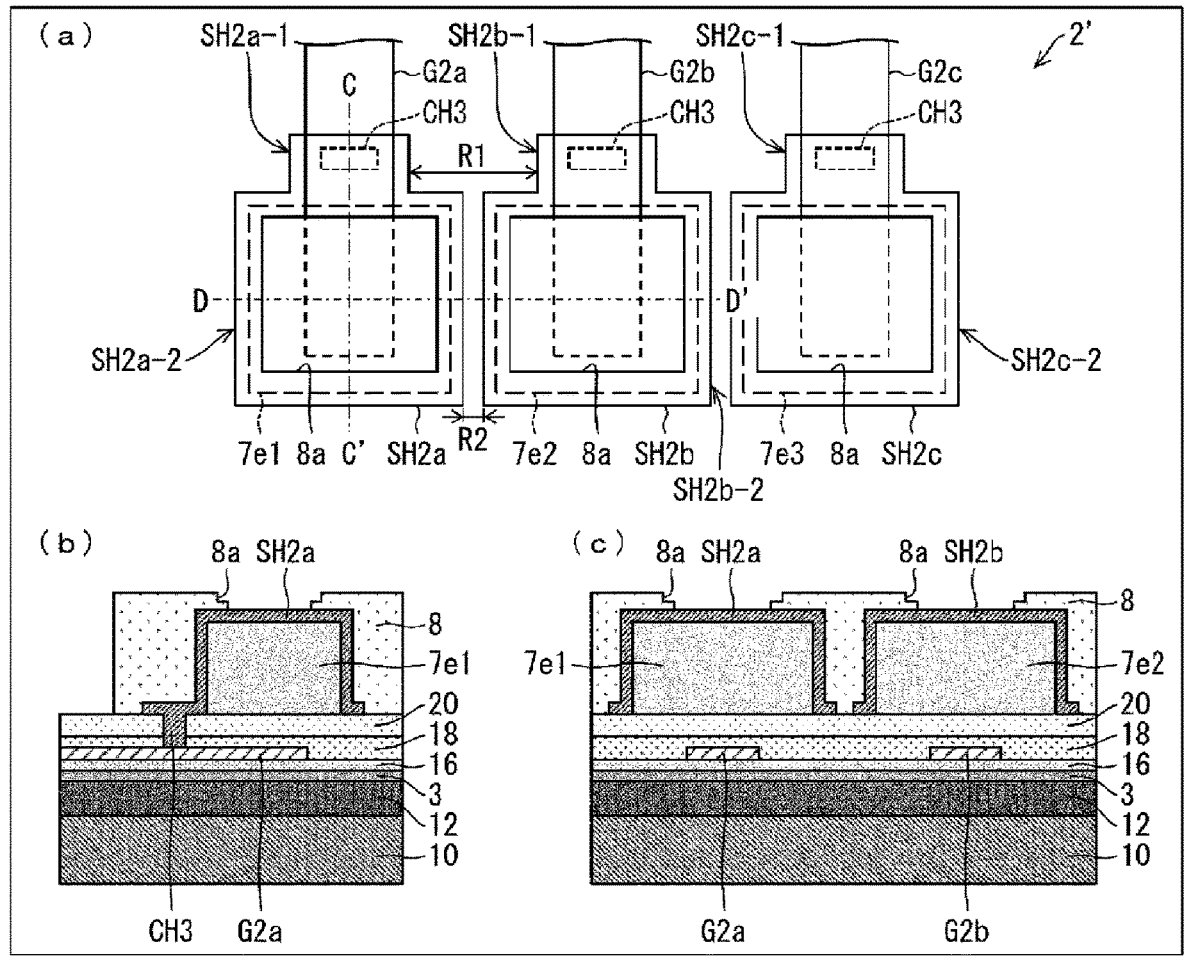
FIG. 4(a) is a plan view around terminals of a flexible organic EL display device according to the second embodiment.
FIG. 4(b) is a cross-sectional view of the flexible organic EL display device according to the second embodiment illustrated in FIG. 4(a), which is taken along the line C-C'.
FIG. 4(c) is a cross-sectional view of the flexible organic EL display device according to the second embodiment illustrated in FIG. 4(a), which is taken along the line D-D'.

(a) of FIG. 4 is a plan view around the terminals of the flexible organic EL display device 2'. (b) of FIG. 4 is a cross-sectional view of the flexible organic EL display device 2' according to the second embodiment illustrated in (a) of FIG. 4, which is taken along the line C-C'. (c) of FIG. 4 is a cross-sectional view of the flexible organic EL display device 2' according to the second embodiment illustrated in (a) of FIG. 4, which is taken along the line D-D'.

As illustrated in (a) of FIG. 4, (b) of FIG. 4, and (c) of FIG. 4, in the flexible organic EL display device 2', the protruding portions 7*e*1, 7*e*2, 7*e*3 . . . are formed into a plurality of protruding portions each having an island shape so that one protruding portion is provided for a corresponding one of the plurality of terminals. Further, a surface of each of the plurality of protruding portions 7*e*1, 7*e*2, 7*e*3 . . . each formed to have an island shape is covered by a corresponding one of the third conductive members SH2*a*, SH2*b*, SH2*c* . . . being the second metal layer.

As described above, in the flexible organic EL display device 2', the plurality of terminals and the protruding portions 7*e*1, 7*e*2, 7*e*3 . . . are disposed in a linear shape in the direction perpendicular to the extension direction of the lead wiring lines G2*a*, G2*b*, G2*c* . . . , in consideration of the fact that a residue is liable to be left at the time of patterning of the second metal layer. Accordingly, generation of a residue in the protruding portions 7*e*1, 7*e*2, 7*e*3 . . . can be suppressed at the time of patterning of the second metal layer.

Note that, as illustrated in (a) of FIG. 4, the present embodiment has provided description by taking an example of a case in which the protruding portions 7*e*1, 7*e*2, 7*e*3 . . . and the plurality of terminals are formed so that both the numbers match on a one-to-one basis. However, this is not restrictive.

Third Embodiment

Next, with reference to FIG. 5, the third embodiment of the disclosure will be described. A flexible organic EL display device 2" according to the present embodiment is different from the first and second embodiments in the following respects: The flexible organic EL display device 2" includes a first terminal group and a second terminal group, the first terminal group shares a first protruding portion 7*b*', and the second terminal group shares a second protruding portion 7*b*. Other configurations are the same as those described in the first and second embodiments. For convenience of description, members having the same functions as those of the members illustrated in the drawings in the first and second embodiments are denoted by the same reference numerals, and descriptions thereof will be omitted.

Figure 5:
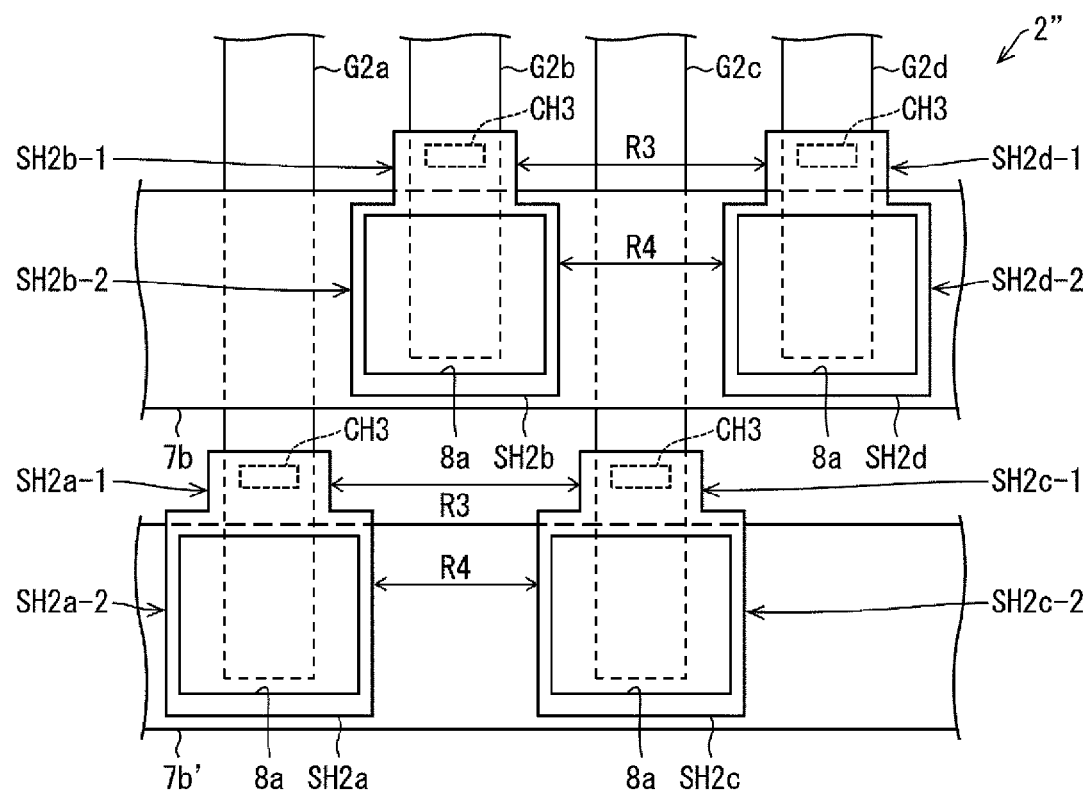
FIG. 5 is a plan view around terminals of a flexible organic EL display device according to the third embodiment.

FIG. 5 is a plan view around the terminals of the flexible organic EL display device 2".

As illustrated in the figure, the first terminal group being a terminal group positioned on the lower side of the figure is such a terminal group that a plurality of terminals that are electrically connected to the lead wiring lines G2*a*, G2*c* . . . of the plurality of lead wiring lines G2*a*, G2*b*, G2*c*, G2*d* . . . are disposed in a direction (horizontal direction in the figure) perpendicular to the extension direction (vertical direction in the figure) of the lead wiring lines G2*a*, G2*b*, G2*c*, G2*d* . . . . The lead wiring lines G2*a*, G2*c* are lead wiring lines that are not adjacent to each other.

Further, the second terminal group being a terminal group positioned on the upper side of the figure is such a terminal group that a plurality of terminals that are electrically connected to the lead wiring lines G2*b*, G2*d* . . . of the plurality of lead wiring lines G2*a*, G2*b*, G2*c*, G2*d* . . . are disposed in the direction (horizontal direction in the figure) perpendicular to the extension direction (vertical direction in the figure) of the lead wiring lines G2*a*, G2*b*, G2*c*, G2*d* . . . . The lead wiring lines G2*b*, G2*d* are lead wiring lines that are not adjacent to each other.

The first protruding portion 7*b*' and the second protruding portion 7*b* are formed to extend in the direction (horizontal direction in the figure) perpendicular to the extension direction (vertical direction in the figure) of the lead wiring lines G2*a*, G2*b*, G2*c*, G2*d* . . . .

The first terminal group being a terminal group positioned on the lower side of the figure shares the first protruding portion 7*b*', and the second terminal group being a terminal group positioned on the upper side of the figure shares the second protruding portion 7*b*.

In the flexible organic EL display device 2", the plurality of terminals are alternately disposed in the extension direction (vertical direction in the figure) of the lead wiring lines G2*a*, G2*b*, G2*c*, G2*d* . . . so as to form the first terminal group and the second terminal group, and the first protruding portion 7*b*' and the second protruding portion 7*b* are formed so that the first terminal group can share the first protruding portion 7*b*' and the second terminal group can share the second protruding portion 7*b*.

As described above, in the flexible organic EL display device 2″, the first terminal group and the protruding portion 7b' are disposed in a linear shape in the direction perpendicular to the extension direction of the lead wiring lines G2a, G2b, G2c . . . , and the second terminal group and the protruding portion 7b are disposed in a linear shape in the direction perpendicular to the extension direction of the lead wiring lines G2a, G2b, G2c . . . , in consideration of the fact that a residue is liable to be left at the time of patterning of the second metal layer.

In the flexible organic EL display device 2″, an interval R3 between adjacent ones of the small-width region SH2a-1, SH2c-1 . . . of the third conductive members SH2a, SH2b, SH2c . . . and an interval R3 between adjacent ones of the small-width region SH2b-1, SH2d-1 . . . thereof are each larger than the interval R1 described above in the first embodiment. Further, an interval R4 between adjacent ones of the large-width regions SH2a-2, SH2c-2 . . . of the third conductive members SH2a, SH2b, SH2c . . . and an interval R4 between adjacent ones of the large-width regions SH2b-2, SH2d-2 . . . thereof are each larger than the interval R2 described above in the first embodiment.

Accordingly, generation of a residue in the protruding portion 7b' can be suppressed at the time of patterning of the second metal layer even when one end portion of the protruding portion 7b' is disposed at a portion (interval R4) between adjacent ones of the large-width regions SH2a-2, SH2c-2 . . . of the third conductive member SH2a, SH2c . . . .

The present embodiment has provided description by taking an example of a case in which one end portion of the protruding portion 7b' is disposed at a portion (interval R4) between adjacent ones of the large-width regions SH2a-2, SH2c-2 . . . of the third conductive member SH2a, SH2c . . . , and one end portion of the protruding portion 7b is disposed at a portion (interval R3) between adjacent ones of the small-width region SH2b-1, SH2d-1 . . . of the third conductive member SH2b, SH2d . . . . However, this is not restrictive.

Fourth Embodiment

Next, with reference to FIG. 6, the fourth embodiment of the disclosure will be described. A flexible organic EL display device 2‴ according to the present embodiment is different from the third embodiment in the following respects: The flexible organic EL display device 2‴ includes a first terminal group and a second terminal group, and protruding portions 7e1', 7e1, 7e2', 7e2 . . . are formed into a plurality of protruding portions each having an island shape so that one protruding portion is provided for one terminal of the first terminal group and the second terminal group. Other configurations are the same as those described in the third embodiment. For convenience of description, members having the same functions as those of the members illustrated in the drawings in the third embodiment are denoted by the same reference numerals, and descriptions thereof will be omitted.

Figure 6:
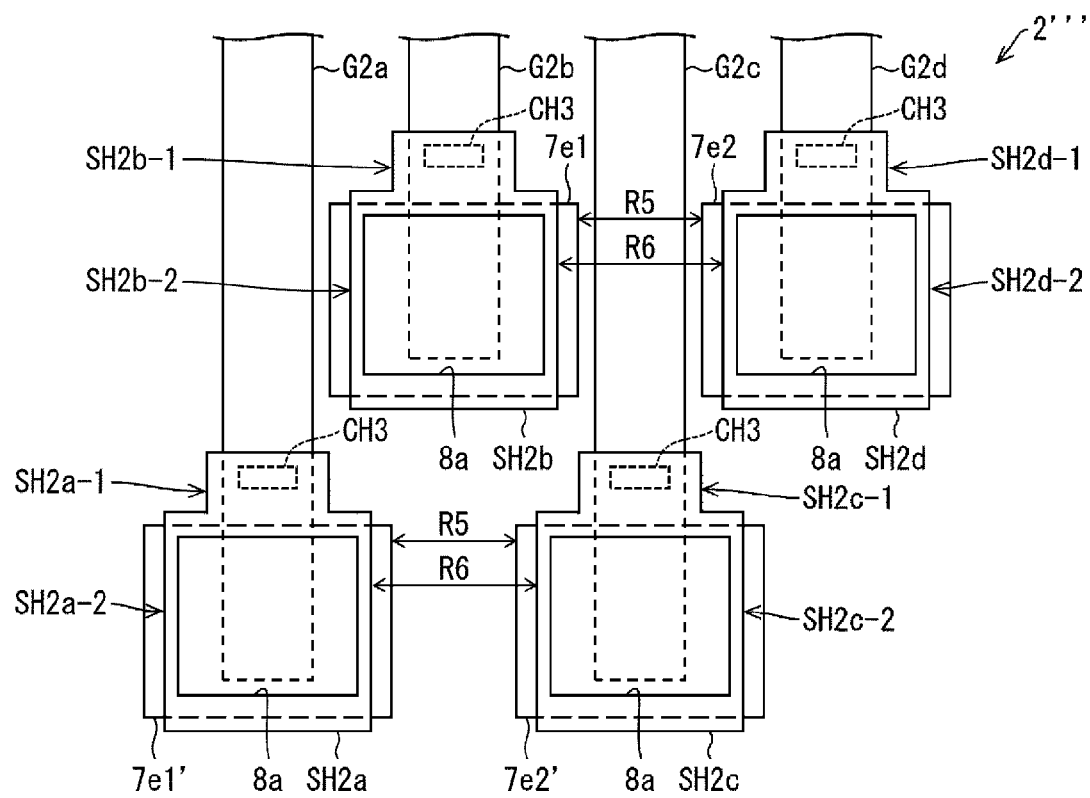
FIG. 6 is a plan view around terminals of a flexible organic EL display device according to the fourth embodiment.

FIG. 6 is a plan view around the terminals of the flexible organic EL display device 2‴.

As illustrated in the figure, the first terminal group being a terminal group positioned on the lower side of the figure is such a terminal group that a plurality of terminals that are electrically connected to the lead wiring lines G2a, G2c . . . of the plurality of lead wiring lines G2a, G2b, G2c, G2d . . . are disposed in the direction (horizontal direction in the figure) perpendicular to the extension direction (vertical direction in the figure) of the lead wiring lines G2a, G2b, G2c, G2d . . . . The lead wiring lines G2a, G2c are lead wiring lines that are not adjacent to each other.

Further, the second terminal group being a terminal group positioned on the upper side of the figure is such a terminal group that a plurality of terminals that are electrically connected to the lead wiring lines G2b, G2d . . . of the plurality of lead wiring lines G2a, G2b, G2c, G2d . . . are disposed in the direction (horizontal direction in the figure) perpendicular to the extension direction (vertical direction in the figure) of the lead wiring lines G2a, G2b, G2c, G2d . . . . The lead wiring lines G2b, G2d are lead wiring lines that are not adjacent to each other.

The protruding portions 7e1', 7e1, 7e2', 7e2 . . . are formed into a plurality of protruding portions each having an island shape so that one protruding portion is provided for one terminal of the first terminal group and the second terminal group. In the direction (horizontal direction in the figure) perpendicular to the extension direction (vertical direction in the figure) of the lead wiring lines G2a, G2b, G2c, G2d . . . , the width of each of the third conductive members SH2a, SH2b, SH2c . . . being the second metal layer is smaller than the width of a corresponding one of the protruding portions 7e1', 7e1, 7e2', 7e2 . . . .

As described above, in the flexible organic EL display device 2‴, the first terminal group and the protruding portions 7e1', 7e2' . . . are disposed in a linear shape in the direction perpendicular to the extension direction of the lead wiring lines G2a, G2b, G2c . . . , and the second terminal group and the protruding portions 7e1, 7e2 . . . are disposed in a linear shape in the direction perpendicular to the extension direction of the lead wiring lines G2a, G2b, G2c . . . , in consideration of the fact that a residue is liable to be left at the time of patterning of the second metal layer.

As illustrated in FIG. 6, in the flexible organic EL display device 2‴, in the direction perpendicular to the extension direction of the lead wiring lines G2a, G2b, G2c . . . , an interval R6 between adjacent ones of the large-width regions SH2a-2, SH2c-2 . . . of the third conductive members SH2a, SH2b, SH2c . . . and an interval R6 between adjacent ones of the large-width regions SH2b-2, SH2d-2 . . . thereof are larger than an interval R5 between adjacent ones of the protruding portions 7e1, 7e2 . . . and an interval R5 between adjacent ones of the protruding portions 7e1', 7e2' . . . .

Further, in the flexible organic EL display device 2‴, an interval between adjacent ones of the small-width region SH2a-1, SH2c-1 . . . of the third conductive members SH2a, SH2b, SH2c . . . and an interval between adjacent ones of the small-width region SH2b-1, SH2d-1 . . . thereof are each larger than the interval R1 described above in the first embodiment. Further, the interval R6 between adjacent ones of the large-width regions SH2a-2, SH2c-2 . . . of the third conductive members SH2a, SH2b, SH2c . . . and the interval R6 between adjacent ones of the large-width regions SH2b-2, SH2d-2 . . . thereof are each larger than the interval R2 described above in the first embodiment.

Accordingly, generation of a residue in the protruding portions 7e1', 7e2' . . . can be suppressed at the time of patterning of the second metal layer even when one end portion of the protruding portions 7e1', 7e2' . . . is disposed at a portion (interval R6) between adjacent ones of the large-width regions SH2a-2, SH2c-2 . . . .

Further, generation of a residue in the protruding portions 7e1, 7e2 . . . can be suppressed at the time of patterning of the second metal layer even when one end portion of the protruding portions 7e1, 7e2 . . . is disposed at a portion (interval R6) between adjacent ones of the large-width regions SH2b-2, SH2d-2 . . . .

Fifth Embodiment

Next, with reference to FIG. 7, the fifth embodiment of the disclosure will be described. A flexible organic EL display device 2a according to the present embodiment is different from the first to fourth embodiments in the following respects: In a part between the bending slit CL and a corresponding one of the plurality of terminals TM, the flexible organic EL display device 2a includes a first slit SL1 that is formed by removing at least a part of the inorganic layered film consisting of the barrier layer 3, the inorganic insulating film 16, the inorganic insulating film 18, and the inorganic insulating film 20. Other configurations are the same as those described in the first to fourth embodiments. For convenience of description, members having the same functions as those of the members illustrated in the drawings in the first to fourth embodiments are denoted by the same reference numerals, and descriptions thereof will be omitted.

Figure 7:
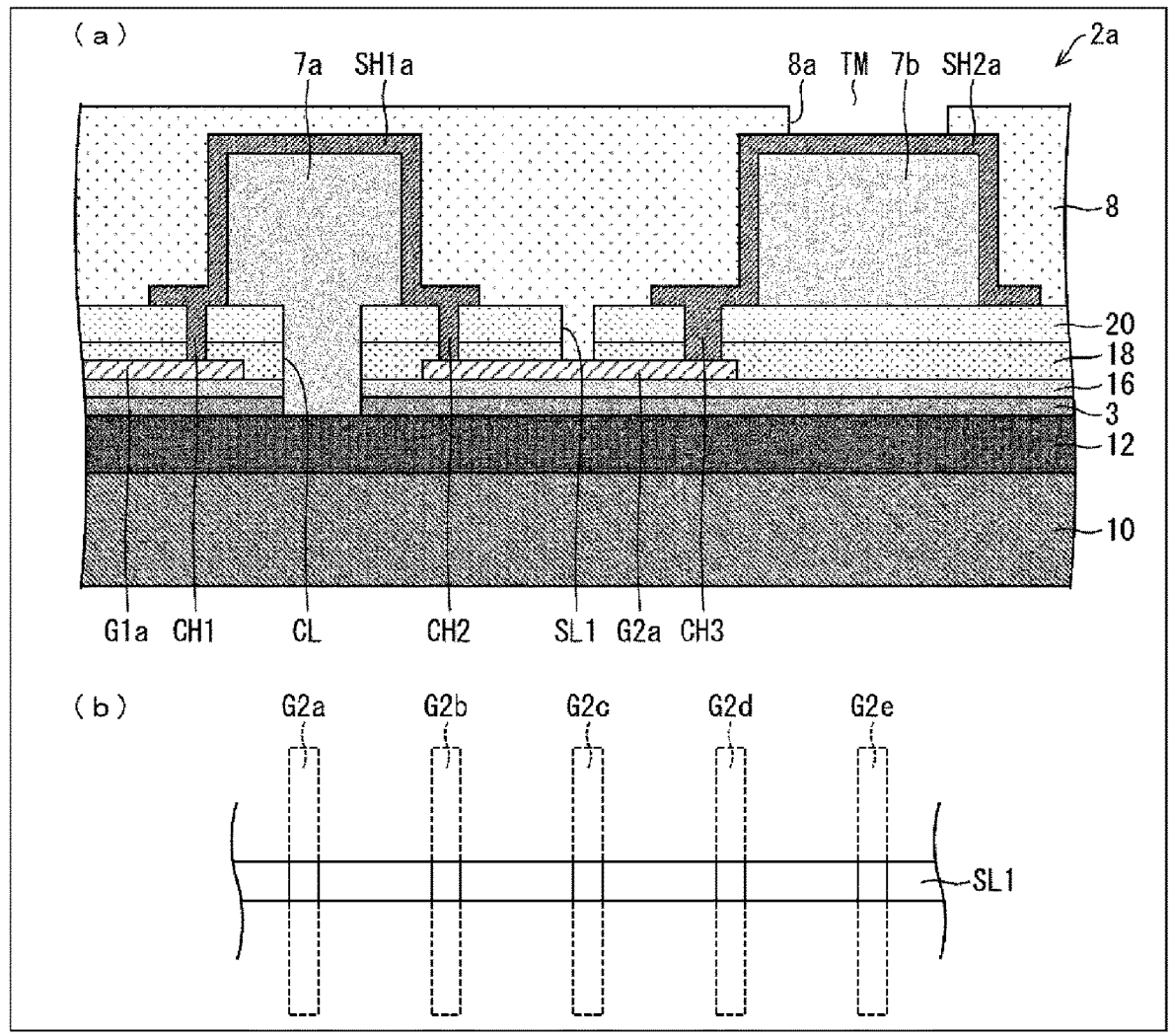
FIG. 7(a) is a cross-sectional view illustrating a part of a frame region of a flexible organic EL display device according to the fifth embodiment.
FIG. 7(b) is a plan view around a first slit of the flexible organic EL display device according to the fifth embodiment.

(a) of FIG. 7 is a cross-sectional view illustrating a part of the frame region NA of the flexible organic EL display device 2a. (b) of FIG. 7 is a plan view around the first slit SL1 of the flexible organic EL display device 2a.

As illustrated in (a) of FIG. 7 and (b) of FIG. 7, the flexible organic EL display device 2a includes, in the partial region of the frame region NA, the first slit SL1 being a single opening that is formed from one end portion to another end portion in the second direction orthogonal to the first direction being the extension direction of each of the plurality of wiring lines TW, similarly to the bending slit CL according to the first embodiment described above.

In the present embodiment, the first slit SL1 is such a single opening that is formed by removing the inorganic insulating film 18 and the inorganic insulating film 20 in a part where the lead wiring lines G2a, G2b, G2c, G2d, G2e are formed, and removing the barrier layer 3, the inorganic insulating film 16, the inorganic insulating film 18, and the inorganic insulating film 20 in a part where the lead wiring lines G2a, G2b, G2c, G2d, G2e are not formed. The single opening exposes a part of each of the lead wiring lines G2a, G2b, G2c, G2d, G2e formed using the same material as the metal material used to form the gate electrode GE in the thin film transistor Tr illustrated in FIG. 2.

Specifically, each of the lead wiring lines G2a, G2b, G2c, G2d, G2e intersects the first slit SL1, and is formed in a layer lower than the first slit SL1.

Further, the first slit SL1 is filled by the second resin layer 8.

Note that the present embodiment provides description by taking an example of a case in which the first slit SL1 is a single opening. However, this is not restrictive. As in the seventh embodiment to be described later, the first slit SL1 may include a plurality of openings.

Owing to such a configuration that the flexible organic EL display device 2a includes the first slit SL1, even when cracks are generated in the inorganic insulating film 18 and the inorganic insulating film 20 being foundation films for the terminals TM when an electronic circuit board is mounted on the terminals TM, the first slit SL1 can suppress expansion of the cracks toward the display region DA side.

Note that the process of forming the first slit SL1 and the process of forming the bending slit CL may be a single (the same) process. For example, the first slit SL1 and the bending slit CL can be formed in a single dry etching process.

Note that the present embodiment has provided description by taking an example of the flexible organic EL display device 2a that includes the bending slit CL. However, the present embodiment need not necessarily include the bending slit CL or need not necessarily be applied to a flexible display device (flexible display device). The present embodiment may be applied to a non-flexible display device (non-flexible display device).

Sixth Embodiment

Next, with reference to FIG. 8, the sixth embodiment of the disclosure will be described. A flexible organic EL display device 2b according to the present embodiment is different from the fifth embodiment in the following respects: In the flexible organic EL display device 2b, a part of each of the lead wiring lines G2a, G2b, G2c, G2d, G2e that is exposed through the first slit SL1 provided between the bending slit CL and a corresponding one of the plurality of terminals TM is covered by a corresponding one of a plurality of second conductive members SH3a, SH3b, SH3c, SH3d, SH3e that are formed using the same material as the metal material used to form the source-drain wiring line SH in the thin film transistor Tr illustrated in FIG. 2 and that are each formed to have an island shape. Other configurations are the same as those described in the fifth embodiment. For convenience of description, members having the same functions as those of the members illustrated in the drawings in the fifth embodiment are denoted by the same reference numerals, and descriptions thereof will be omitted.

Figure 8:
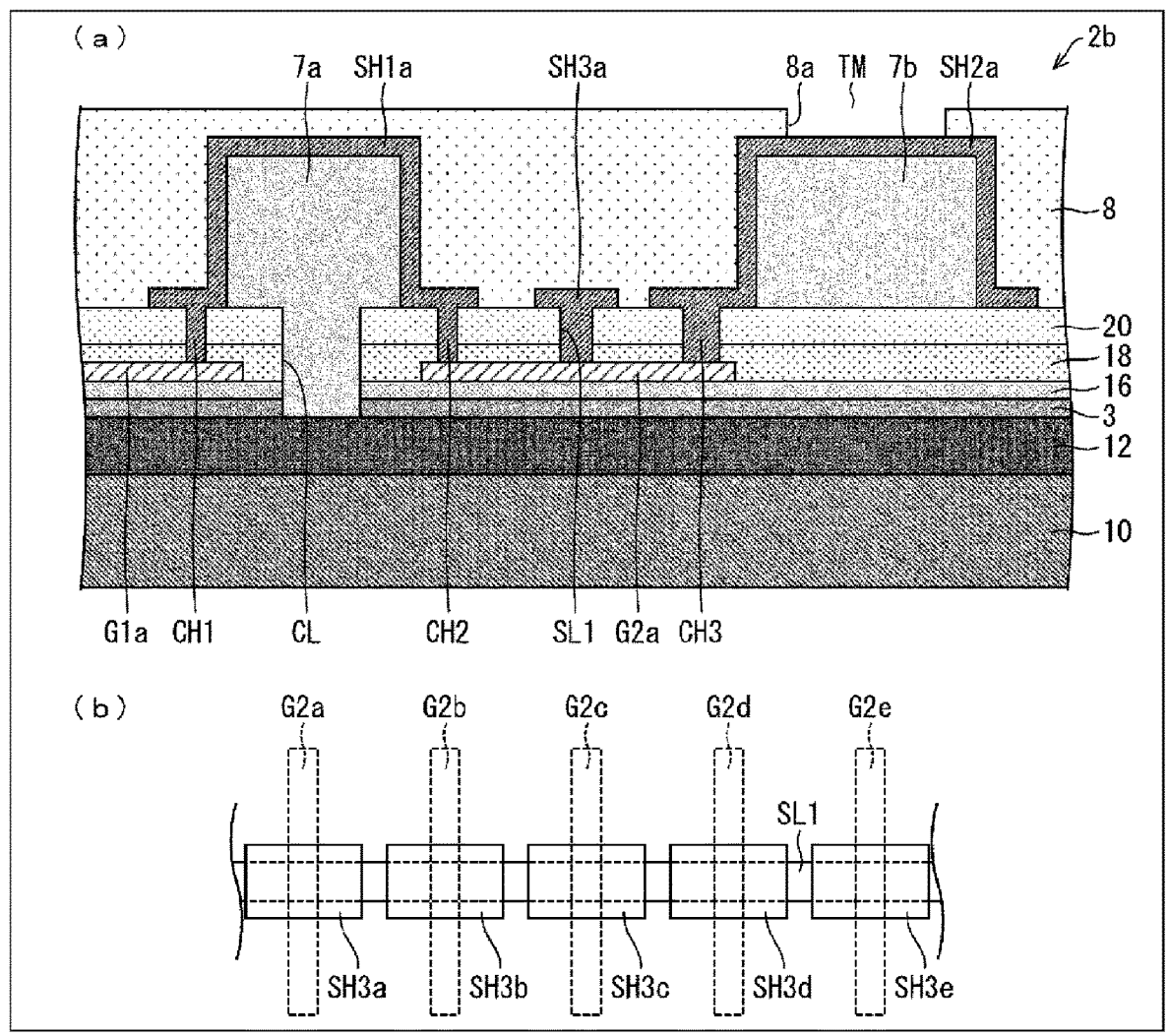
FIG. 8(a) is a cross-sectional view illustrating a part of a frame region of a flexible organic EL display device according to the sixth embodiment.
FIG. 8(b) is a plan view around a first slit of the flexible organic EL display device according to the sixth embodiment.

(a) of FIG. 8 is a cross-sectional view illustrating a part of the frame region NA of the flexible organic EL display device 2b. (b) of FIG. 8 is a plan view around the first slit SL1 of the flexible organic EL display device 2b.

As illustrated in (a) of FIG. 8 and (b) FIG. 8, in the flexible organic EL display device 2b, a part of each of the lead wiring lines G2a, G2b, G2c, G2d, G2e that is exposed through the first slit SL1 provided between the bending slit CL and a corresponding one of the plurality of terminals TM is covered by a corresponding one of the plurality of second conductive members SH3a, SH3b, SH3c, SH3d, SH3e that are formed using the same material as the metal material used to form the source-drain wiring line SH in the thin film transistor Tr illustrated in FIG. 2. Specifically, each of the plurality of lead wiring lines G2a, G2b, G2c, G2d, G2e overlapping the first slit SL1 is covered by a corresponding one of the second conductive members SH3a, SH3b, SH3c, SH3d, SH3e.

Owing to such a configuration, a part of each of the lead wiring lines G2a, G2b, G2c, G2d, G2e exposed through the first slit SL1 can be protected by a corresponding one of the plurality of second conductive members SH3a, SH3b, SH3c, SH3d, SH3e, when first conductive members SH1a, SH1b, SH1c, SH1d, SH1e, third conductive members SH2a, SH2b, SH2c, SH2d, SH2e, and the plurality of second conductive members SH3a, SH3b, SH3c, SH3d, SH3e formed using the same material as the metal material used to form the source-drain wiring line SH in the thin film transistor Tr illustrated in FIG. 2, which are included in each of the wiring lines TW, are patterned into respective predetermined shapes.

In contrast, in the fifth embodiment described above, as illustrated in (a) of FIG. 7, a part of each of the lead wiring lines G2a, G2b, G2c, G2d, G2e exposed through the first slit SL1 is not protected by the plurality of second conductive members SH3a, SH3b, SH3c, SH3d, SH3e, when the first conductive members SH1a, SH1b, SH1c, SH1d, SH1e and the third conductive members SH2a, SH2b, SH2c, SH2d, SH2e formed using the same material as the metal material used to form the source-drain wiring line SH in the thin film transistor Tr illustrated in FIG. 2, which are included in each of the wiring lines TW, are patterned into respective predetermined shapes. Thus, the part of each of the lead wiring lines G2a, G2b, G2c, G2d, G2e exposed through the first slit SL1 is liable to be damaged.

Note that the present embodiment provides description by taking an example of a case in which the first slit SL1 is a single opening. However, this is not restrictive. As in the seventh embodiment to be described later, the first slit SL1 may include a plurality of openings.

Seventh Embodiment

Next, with reference to FIG. 9, the seventh embodiment of the disclosure will be described. A flexible organic EL display device 2c according to the present embodiment is different from the fifth and sixth embodiments in the following respects: In the flexible organic EL display device 2c, first slits SL2a, SL2b, SL2c, SL2d, SL2e provided between the bending slit CL and a corresponding one of the plurality of terminals TM are a plurality of openings. Other configurations are the same as those described in the fifth and sixth embodiments. For convenience of description, members having the same functions as those of the members illustrated in the drawings in the fifth and sixth embodiments are denoted by the same reference numerals, and descriptions thereof will be omitted.

Figure 9:
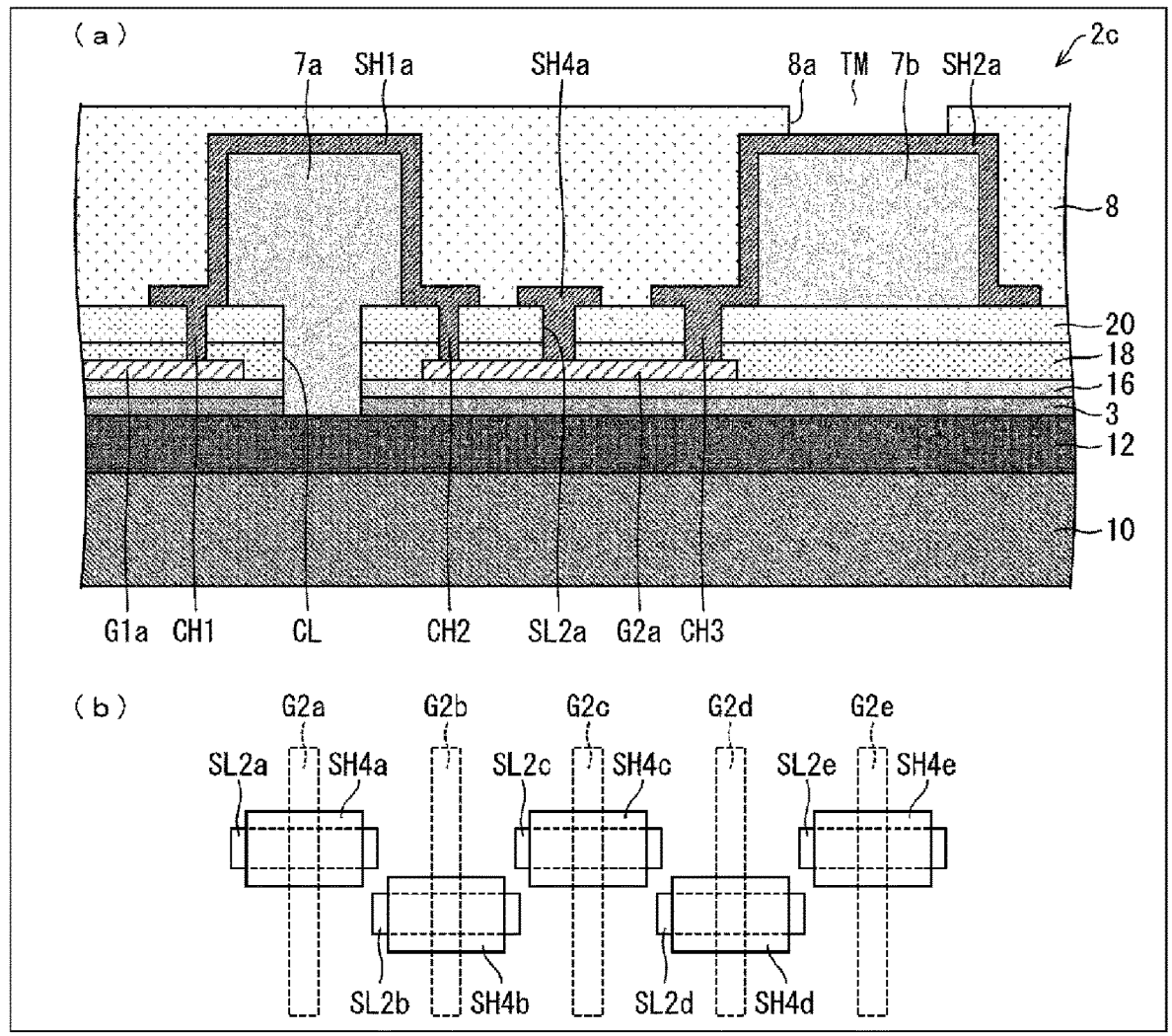
FIG. 9(a) is a cross-sectional view illustrating a part of a frame region of a flexible organic EL display device according to the seventh embodiment.
FIG. 9(b) is a plan view around first slits of the flexible organic EL display device according to the seventh embodiment.

(a) of FIG. 9 is a cross-sectional view illustrating a part of the frame region NA of the flexible organic EL display device 2c. (b) of FIG. 9 is a plan view around the first slits SL2a, SL2b, SL2c, SL2d, SL2e of the flexible organic EL display device 2c.

As illustrated in (a) of FIG. 9 and (b) of FIG. 9, the first slits SL2a, SL2b, SL2c, SL2d, SL2e are a plurality of openings, and thus each of the first slits SL2a, SL2b, SL2c, SL2d, SL2e exposes a part of a corresponding one of the lead wiring lines G2a, G2b, G2c, G2d, G2e.

In the present embodiment, the first slits SL2a, SL2b, SL2c, SL2d, SL2e . . . being a plurality of openings consist of, as illustrated in (b) of FIG. 9, a first slit group SL2a, SL2c, SL2e . . . and a second slit group SL2b, SL2d . . . .

The first slit group SL2a, SL2c, SL2e . . . is such a slit group that some first slits of the plurality of first slits each having an island shape that intersect the lead wiring lines G2a, G2c, G2e . . . of the plurality of lead wiring lines G2a, G2b, G2c, G2d, G2e . . . are disposed in the direction perpendicular to the extension direction of the lead wiring lines G2a, G2b, G2c, G2d, G2e . . . . The lead wiring lines G2a, G2c, G2e are lead wiring lines that are not adjacent to each other.

The second slit group SL2b, SL2d . . . is such a slit group that first slits other than the above-described some first slits of the plurality of first slits each having an island shape that intersect the lead wiring lines G2b, G2d . . . of the plurality of lead wiring lines G2a, G2b, G2c, G2d, G2e . . . are disposed in the direction perpendicular to the extension direction of the lead wiring lines. The lead wiring lines G2b, G2d . . . are lead wiring lines that are not adjacent to each other.

In the flexible organic EL display device 2c, each of the first slits SL2a, SL2b, SL2c, SL2d, SL2e being one of a plurality of openings overlaps a corresponding one of the lead wiring lines G2a, G2b, G2c, G2d, G2e, and each of the first slits SL2a, SL2b, SL2c, SL2d, SL2e exposes a part of a corresponding one of the lead wiring lines G2a, G2b, G2c, G2d, G2e.

In the first slit SL1 being a single opening according to the fifth and sixth embodiments described above, a residue of a layer formed using the same material as the metal material used to form the source-drain wiring line SH in the thin film transistor Tr illustrated in FIG. 2 is liable to be left at end portions of the slit. This may cause leakage between adjacent ones of the plurality of wiring lines TW.

In the light of this, in the present embodiment, each of the first slits SL2a, SL2b, SL2c, SL2d, SL2e being one of a plurality of openings overlaps a corresponding one of the lead wiring lines G2a, G2b, G2c, G2d, G2e. Owing to this configuration, even if a residue is left at end portions of each of the first slits SL2a, SL2b, SL2c, SL2d, SL2e, the residue does not affect adjacent wiring lines TW, and thus leakage to be caused between adjacent ones of the plurality of wiring lines TW can be suppressed.

Note that, in the flexible organic EL display device 2c, a part of each of the lead wiring lines G2a, G2b, G2c, G2d, G2e . . . exposed through a corresponding one of the first slits SL2a, SL2b, SL2c, SL2d, SL2e . . . being one of a plurality of openings each provided between the bending slit CL and a corresponding one of the plurality of terminals TM is covered by a corresponding one of the plurality of second conductive members SH4a, SH4b, SH4c, SH4d, SH4e . . . that are formed using the same material as the metal material used to form the source-drain wiring line SH in the thin film transistor Tr illustrated in FIG. 2 and that are each formed to have an island shape.

Owing to such a configuration, a part of each of the lead wiring lines G2a, G2b, G2c, G2d, G2e exposed through a corresponding one of the first slits SL2a, SL2b, SL2c, SL2d, SL2e being one of a plurality of openings can be protected by a corresponding one of the plurality of second conductive members SH4a, SH4b, SH4c, SH4d, SH4e, when the first conductive members SH1a, SH1b, SH1c, SH1d, SH1e, the third conductive members SH2a, SH2b, SH2c, SH2d, SH2e, and the plurality of second conductive members SH4a, SH4b, SH4c, SH4d, SH4e formed using the same material as the metal material used to form the source-drain wiring line SH in the thin film transistor Tr illustrated in FIG. 2, which are included in each of the wiring lines TW, are patterned into respective predetermined shapes.

Eighth Embodiment

Next, with reference to FIG. 10, the eighth embodiment of the disclosure will be described. A flexible organic EL display device 2d according to the present embodiment is different from the first to seventh embodiments in the following respects: The flexible organic EL display device 2d includes a second slit SL8 in a part that is inside the frame region NA and is outside the partial region of the frame region NA where the plurality of terminals TM are formed, and third conductive members SH5a, SH5b, SH5c, SH5d, SH5e . . . formed using the same material as the metal material used to form the source-drain wiring line SH in the thin film transistor Tr illustrated in FIG. 2 are formed on a first slit SL7 that is filled by a third resin layer 7c formed using the same material as the protruding portion 7b. Other configurations are the same as those described in the first to seventh embodiments. For convenience of description, members having the same functions as those of the members illustrated in the drawings in the first to seventh embodiments are denoted by the same reference numerals, and descriptions thereof will be omitted.

Figure 10:
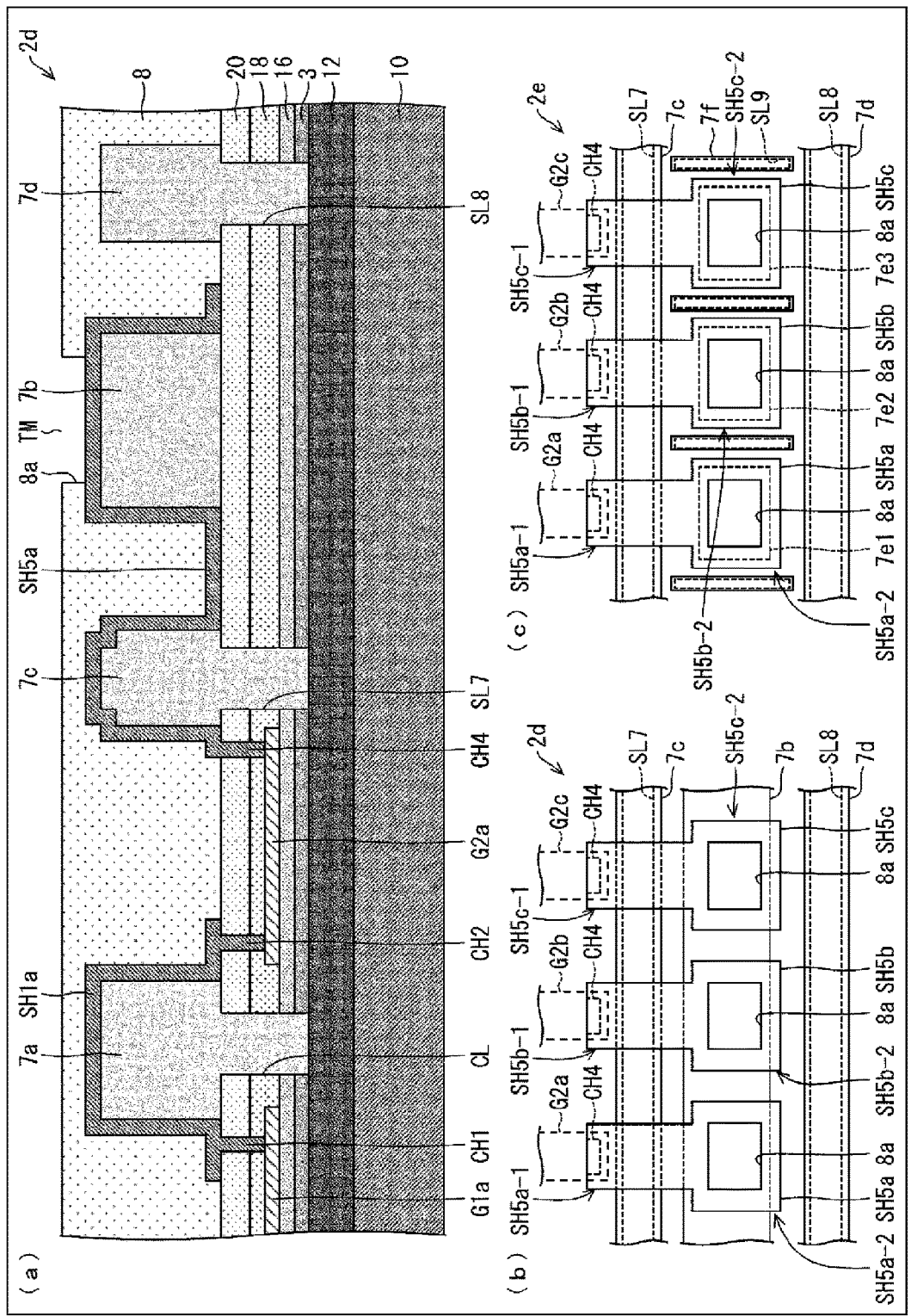
FIG. 10(a) is a cross-sectional view illustrating a part of a frame region of a flexible organic EL display device according to the eighth embodiment.
FIG. 10(b) is a plan view around terminals of the flexible organic EL display device according to the eighth embodiment.
FIG. 10(c) is a plan view around terminals of a modification of the flexible organic EL display device according to the eighth embodiment.

(a) of FIG. 10 is a cross-sectional view illustrating a part of the frame region NA of the flexible organic EL display device 2d. (b) of FIG. 10 is a plan view around the terminals TM of the flexible organic EL display device 2d.

As illustrated in (a) of FIG. 10 and (b) of FIG. 10, the flexible organic EL display device 2d includes the second slit SL8 in a part that is inside the frame region NA and is outside the partial region of the frame region NA where the plurality of terminals TM are formed, and the second slit SL8 is filled by a third resin layer 7d formed using the same material as the protruding portion 7b. Note that a part that is inside the frame region NA and is inside the partial region of the frame region NA where the plurality of terminals TM are formed is a region that adjoins the display region DA.

In a part between the bending slit CL and a corresponding one of the plurality of terminals TM, the flexible organic EL display device 2d includes the first slit SL7 that is formed by removing the barrier layer 3, the inorganic insulating film 16, the inorganic insulating film 18, and the inorganic insulating film 20. In addition, in a part that is inside the frame region NA and is outside the partial region of the frame region NA where the plurality of terminals TM are further formed, the flexible organic EL display device 2d also includes the second slit SL8 that is formed by removing the barrier layer 3, the inorganic insulating film 16, the inorganic insulating film 18, and the inorganic insulating film 20.

Accordingly, even when cracks are generated in the barrier layer 3, the inorganic insulating film 16, the inorganic insulating film 18, and the inorganic insulating film 20 being foundation films for the terminals TM when an electronic circuit board is mounted on the terminals TM, the first slit SL7 can suppress expansion of the cracks toward the display region DA, and at the same time, the second slit SL8 can suppress expansion of the cracks toward the outside of the second slit SL8.

Further, the first slit SL7 is filled by the third resin layer 7c formed using the same material as the protruding portion 7b. The third conductive members SH5a, SH5b, SH5c, SH5d, SH5e . . . formed using the same material as the metal material used to form the source-drain wiring line SH in the thin film transistor Tr illustrated in FIG. 2 are formed on the third resin layer 7c. A part of each of the third conductive members SH5a, SH5b, SH5c, SH5d, SH5e . . . formed on the protruding portion 7b serves as one terminal TM.

Further, each of the lead wiring lines G2a, G2b, G2c, G2d, G2e . . . is electrically connected to a corresponding one of the third conductive members SH5a, SH5b, SH5c, SH5d, SH5e . . . through a fourth contact hole.

In the present embodiment, the first slit SL7 does not expose any of the lead wiring lines G2a, G2b, G2c, G2d, G2e . . . , and the first slit SL7 is filled by the third resin layer 7c formed using the same material as the protruding portion 7b so as to form the third conductive members SH5a, SH5b, SH5c, SH5d, SH5e on the third resin layer 7c. This configuration prevents a residue of a layer formed using the same material as the metal material used to form the source-drain wiring line SH in the thin film transistor Tr illustrated in FIG. 2 from being left at end portions of the first slit SL7.

Note that, in the present embodiment, the third resin layer 7a being a layer that fills the bending slit CL, the third resin layer 7b for forming the plurality of terminals TM, the third resin layer 7c being a layer that fills the first slit SL7, and the third resin layer 7d being a layer that fills the second slit SL8 are formed through a single process by using the same material, and the height of each of such layers is thus formed to be the same. However, this is not restrictive, and even when a single process using the same material is performed, the height of each of such layers can be formed to be different with the use of a halftone mask. Alternatively, when different processes using different materials are performed, the height of each of such layers can be formed to be different by adopting different light exposure values.

(c) of FIG. 10 is a plan view around the terminals of a flexible organic EL display device 2e being a modification of the flexible organic EL display device 2d.

When the flexible organic EL display device 2e illustrated in (c) of FIG. 10 is used, the protruding portions 7e1, 7e2, 7e3 . . . are a layer including a plurality of protruding portions each having an island shape, and the protruding portions 7e1, 7e2, 7e3 . . . are formed so that one protruding portion is provided for a corresponding one of the plurality of terminals, as with the above-described case of the modification of the flexible organic EL display device 2' illustrated in FIG. 4.

Further, as illustrated in (c) of FIG. 10, when the flexible organic EL display device 2e is used, in addition to the first slit SL7 and the second slit SL8, a plurality of third slits SL9 are provided at portions between adjacent ones of protruding portions 7e1, 7e2, 7e3, 7e4, 7e5 . . . . Each of the plurality of third slits SL9 is formed by removing at least a part of the barrier layer 3, the inorganic insulating film 16, the inorganic insulating film 18, and the inorganic insulating film 20 so as to be formed along an end portion that extends along the first direction (vertical direction in the figure) being the extension direction of each of the plurality of wiring lines TW.

Note that each of the third slits SL9 is filled by a third resin layer 7f formed using the same material as the layer for forming the protruding portions 7e1, 7e2, 7e3 . . . .

Accordingly, even when cracks are generated in the barrier layer 3, the inorganic insulating film 16, the inorganic insulating film 18, and the inorganic insulating film 20 being foundation films for the terminals TM when an electronic circuit board is mounted on the terminals TM, each of the third slits SL9 can suppress expansion of the cracks in the horizontal direction in the figure, that is, in a direction toward adjacent wiring lines TW.

The present embodiment has provided description by taking an example of a case in which the first slit SL7 being a single opening is formed. However, this is not restrictive, and a plurality of openings may be formed as the first slit, similarly to the seventh embodiment described above.

Supplement

First Aspect

A display device including:
a substrate;
a display element defining a display region being provided above the substrate so that the display element and the substrate interpose a TFT layer;
a frame region being provided around the display region; and
a terminal being provided at an end portion of the frame region and being configured to input a signal from outside,
wherein the TFT layer includes, sequentially from a side of the substrate, a first inorganic layer, a first metal layer, a second inorganic layer, a second metal layer, and a first resin layer, a lead wiring line being configured to transmit the signal from the terminal to a signal line in the display region is formed in a part of the frame region between the display region and the terminal, the lead wiring line being formed using the first metal layer, the terminal is formed using the second metal layer exposed through an opening of a second resin layer, in the opening of the second resin layer, a protruding portion being formed using a third resin layer being a layer lower than the second resin layer and the second metal layer overlap each other, and the lead wiring line and the second metal layer are electrically connected through a contact hole being formed in the second inorganic layer.

Second Aspect

The display device according to the first aspect, wherein the second metal layer includes large-width regions and small-width regions, each of the large-width regions including a portion exposed through the opening of the second resin layer, each of the small-width regions extending from the large-width region toward a side of the display region and including a portion to be electrically connect to the lead wiring line, in a direction perpendicular to an extension direction of the lead wiring line, an interval between adjacent ones of the small-width regions of the second metal layer is larger than an interval between adjacent ones of the large-width regions of the second metal layer, and entire regions of the large-width regions of the second metal layer overlap the protruding portion.

Third Aspect

The display device according to the first or second aspect, wherein the lead wiring line includes a plurality of lead wiring lines being formed, the second metal layer includes a plurality of second metal layers being formed, and the contact hole includes a plurality of contact holes being formed, each of the plurality of lead wiring lines and a corresponding one of the plurality of second metal layers are electrically connected through a corresponding one of the plurality of contact holes, each of a plurality of terminals including the terminal is formed using a corresponding one of the plurality of second metal layers exposed through the opening of the second resin layer, and is formed in the direction perpendicular to the extension direction of the lead wiring line, the protruding portion is formed to extend in the direction perpendicular to the extension direction of the lead wiring line, and the plurality of terminals share the protruding portion.

Fourth Aspect

The display device according to the first or second aspect, wherein the lead wiring line includes a plurality of lead wiring lines being formed, the second metal layer includes a plurality of second metal layers being formed, and the contact hole includes a plurality of contact holes being formed, each of the plurality of lead wiring lines and a corresponding one of the plurality of second metal layers are electrically connected through a corresponding one of the plurality of contact holes, each of a plurality of terminals including the terminal is formed using a corresponding one of the plurality of second metal layers exposed through the opening of the second resin layer, and the plurality of terminals include a first terminal group and a second terminal group, the first terminal group is a terminal group that some terminals of the plurality of terminals electrically connected to some lead wiring lines of the plurality of lead wiring lines are disposed in the direction perpendicular to the extension direction of the lead wiring line, the some lead wiring lines being lead wiring lines not adjacent to each other, the second terminal group is a terminal group that terminals other than the some terminals of the plurality of terminals electrically connected to the some lead wiring lines of the plurality of lead wiring lines are disposed in the direction perpendicular to the extension direction of the lead wiring line, the some lead wiring lines being lead wiring lines not adjacent to each other, the protruding portion includes a first protruding portion and a second protruding portion, the first protruding portion and the second protruding portion being formed to extend in the direction perpendicular to the extension direction of the lead wiring line, the first terminal group shares the first protruding portion, and the second terminal group shares the second protruding portion.

Fifth Aspect

The display device according to the first aspect, wherein the lead wiring line includes a plurality of lead wiring lines being formed, the second metal layer includes a plurality of second metal layers being formed, and the contact hole includes a plurality of contact holes being formed, each of the plurality of lead wiring lines and a corresponding one of the plurality of second metal layers are electrically connected through a corresponding one of the plurality of contact holes, each of a plurality of terminals including the terminal is formed using a corresponding one of the plurality of second metal layers exposed through the opening of the second resin layer, and is formed in the direction perpendicular to the extension direction of the lead wiring line, and the protruding portion is formed into a plurality of protruding portions each having an island shape so that one of the plurality of protruding portions is provided for a corresponding one of the plurality of terminals.

Sixth Aspect

The display device according to the fifth aspect, wherein a surface of each of the plurality of protruding portions each formed to have an island shape is covered by a corresponding one of the plurality of second metal layers.

Seventh Aspect

The display device according to the fifth aspect, wherein the plurality of terminals include a first terminal group and a second terminal group, the first terminal group is a terminal group that some terminals of the plurality of terminals electrically connected to some lead wiring lines of the plurality of lead wiring lines are disposed in the direction perpendicular to the extension direction of the lead wiring line, the some lead wiring lines being lead wiring lines not adjacent to each other, the second terminal group is a terminal group that terminals other than the some terminals of the plurality of terminals electrically connected to the some lead wiring lines of the plurality of lead wiring lines are disposed in the direction perpendicular to the extension direction of the lead wiring line, the some lead wiring lines being lead wiring lines not adjacent to each other, the protruding portion is formed into a plurality of protruding portions each having an island shape so that one of the plurality of protruding portions is provided for a corresponding one of the plurality of terminals of the first terminal group and the second terminal group, and in the direction perpendicular to the extension direction of the lead wiring line, an interval between adjacent ones of the plurality of second metal layers is larger than an interval between adjacent ones of the plurality of protruding portions.

Eighth Aspect

The display device according to any one of the fifth to seventh aspects, wherein an inorganic layered film including the first inorganic layer and the second inorganic layer is formed in the frame region, a third slit formed is formed in the frame region, the third slit being formed by removing at least a part of the inorganic layered film, and the third slit is formed between adjacent ones of the plurality of protruding portions each having an island shape.

Ninth Aspect

The display device according to any one of the first to eighth aspects, wherein the substrate is a flexible substrate, an inorganic layered film including the first inorganic layer and the second inorganic layer is formed in the frame region, a bending slit is formed from one end portion of the flexible substrate to another end portion of the flexible substrate in the direction perpendicular to the extension direction of the lead wiring line, the bending slit being formed by removing at least a part of the inorganic layered film, the bending slit is filled by a same material as the third resin layer, a first slit is formed between the bending slit and the terminal, the first slit being formed by removing at least a part of the inorganic layered film, the lead wiring line is electrically connected to a first conductive member being formed using a same material as the second metal layer, the first conductive member intersects the bending slit being filled by the same material as the third resin layer, and the lead wiring line intersects the first slit, and is formed in a layer lower than the first slit.

Tenth Aspect

The display device according to the ninth aspect, wherein the first slit is formed from the one end portion of the flexible substrate to the another end portion of the flexible substrate in the direction perpendicular to the extension direction of the lead wiring line.

Eleventh Aspect

The display device according to the ninth aspect, wherein the lead wiring line includes a plurality of lead wiring lines being formed, the second metal layer includes a plurality of second metal layers being formed, and the contact hole includes a plurality of contact holes being formed, each of the plurality of lead wiring lines and a corresponding one of the plurality of second metal layers are electrically connected through a corresponding one of the plurality of contact holes, the first slit is formed into a plurality of first slits each having an island shape so that one of the plurality of first slits is provided for a corresponding one of the plurality of lead wiring lines, each of the plurality of lead wiring lines intersects a corresponding one of the plurality of first slits each having an island shape, the plurality of first slits each having an island shape include a first slit group and a second slit group, the first slit group is a slit group that some first slits of the plurality of first slits each having an island shape intersecting some lead wiring lines of the plurality of lead wiring lines are disposed in the direction perpendicular to the extension direction of the lead wiring line, the some lead wiring lines being lead wiring lines not adjacent to each other, and the second slit group is a slit group that some first slits other than the some first slits of the plurality of first slits each having an island shape intersecting the some lead wiring lines of the plurality of lead wiring lines are disposed in the direction perpendicular to the extension direction of the lead wiring line, the some lead wiring lines being lead wiring lines not adjacent to each other.

Twelfth Aspect

The display device according to any one of the ninth to eleventh aspects, wherein the first slit is covered by the second resin layer.

Thirteenth Aspect

The display device according to any one of the ninth to eleventh aspects, wherein the lead wiring line overlapping the first slit is covered by a second conductive member being formed using the same material as the second metal layer and being formed into an island shape.

Fourteenth Aspect

The display device according to the thirteenth aspect, wherein the first slit and the second conductive member are covered by the second resin layer.

Fifteenth Aspect

The display device according to any one of the first to eighth aspects, wherein the substrate is a flexible substrate, an inorganic layered film including the first inorganic layer and the second inorganic layer is formed in the frame region, a bending slit is formed from one end portion of the flexible substrate to another end portion of the flexible substrate in the direction perpendicular to the extension direction of the lead wiring line, the bending slit being formed by removing at least a part of the inorganic layered film, a first slit is formed between the bending slit and the terminal, the first slit being formed by removing at least a part of the inorganic layered film, the bending slit and the first slit are filled by a same material as the third resin layer, the lead wiring line is electrically connected to a first conductive member being formed using a same material as the second metal layer, the first conductive member intersects the bending slit being filled by the same material as the third resin layer, and the second metal layer intersects the first slit filled by the same material as the third resin layer.

Sixteenth Aspect

The display device according to any one of the ninth to fifteenth aspects, wherein a second slit is formed in the frame region, the second slit being formed by removing at least a part of the inorganic layered film, and the terminal is disposed between the first slit and the second slit in the direction perpendicular to the extension direction of the lead wiring line.

Seventeenth Aspect

The display device according to any one of the first to sixteenth aspects, wherein the first resin layer and the second resin layer are formed using a same material.

Eighteenth Aspect

The display device according to any one of the first to seventeenth aspects, wherein the third resin layer is formed in a part of the TFT layer between the second metal layer and the first resin layer.

Nineteenth Aspect

A manufacturing method for a display device including a substrate, a display element defining a display region being provided above the substrate so that the display element and the substrate interpose a TFT layer, a frame region being provided around the display region, and a terminal being provided at an end portion of the frame region and being configured to input a signal from outside, the manufacturing method including the steps of:

forming the TFT layer, the forming the TFT layer including forming a first inorganic layer, forming a first metal layer, forming a second inorganic layer, forming a second metal layer, and forming a first resin layer;

forming a second resin layer; and forming a third resin layer, wherein, in the forming of the first inorganic layer, the first inorganic layer is formed on the substrate, in the forming of the first metal layer, a lead wiring line being configured to transmit the signal from the terminal to a signal line in the display region is formed on the first inorganic layer in a part of the frame region between the display region and the terminal, in the forming of the second inorganic layer, the second inorganic layer is formed to cover the lead wiring line, and a contact hole is then formed at a portion of the second inorganic layer to overlap the lead wiring line, in the forming of the third resin layer, a protruding portion is formed on the second inorganic layer, in the forming of the second metal layer, the second metal layer is formed to overlap the protruding portion and to be electrically connected to the lead wiring line through the contact hole, and in the forming of the second resin layer, an opening is formed at a position at which the protruding portion and the second metal layer overlap each other.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

INDUSTRIAL APPLICABILITY

The disclosure can be utilized for a display device and a method for manufacturing the display device.

The invention claimed is:

1. A display device comprising:
    a substrate;
    a display element defining a display region being provided above the substrate so that the display element and the substrate interpose a TFT layer;
    a frame region being provided around the display region; and
    a terminal being provided at an end portion of the frame region and being configured to input a signal from outside,
    wherein the TFT layer includes, sequentially from a side of the substrate, a first inorganic layer, a first metal layer, a second inorganic layer, a second metal layer, and a first resin layer,
    a lead wiring line being configured to transmit the signal from the terminal to a signal line in the display region is formed in a part of the frame region between the display region and the terminal, the lead wiring line being formed using the first metal layer,
    the terminal is formed using the second metal layer exposed through an opening of a second resin layer,
    in the opening of the second resin layer, a protruding portion being formed using a third resin layer being a layer lower than the second resin layer and the second metal layer overlap each other, and
    the lead wiring line and the second metal layer are electrically connected through a contact hole being formed in the second inorganic layer.

2. The display device according to claim 1,
wherein the second metal layer includes large-width regions and small-width regions, each of the large-width regions including a portion exposed through the opening of the second resin layer, each of the small-width regions extending from the large-width region toward a side of the display region and including a portion to be electrically connect to the lead wiring line,
in a direction perpendicular to an extension direction of the lead wiring line, an interval between adjacent ones of the small-width regions of the second metal layer is larger than an interval between adjacent ones of the large-width regions of the second metal layer, and
entire regions of the large-width regions of the second metal layer overlap the protruding portion.

3. The display device according to claim 1,
wherein the lead wiring line includes a plurality of lead wiring lines being formed, the second metal layer includes a plurality of second metal layers being formed, and the contact hole includes a plurality of contact holes being formed,
each of the plurality of lead wiring lines and a corresponding one of the plurality of second metal layers are electrically connected through a corresponding one of the plurality of contact holes,
each of a plurality of terminals including the terminal is formed using a corresponding one of the plurality of second metal layers exposed through the opening of the second resin layer, and is formed in the direction perpendicular to the extension direction of the lead wiring line,
the protruding portion is formed to extend in the direction perpendicular to the extension direction of the lead wiring line, and
the plurality of terminals share the protruding portion.

4. The display device according to claim 1,
wherein the lead wiring line includes a plurality of lead wiring lines being formed, the second metal layer includes a plurality of second metal layers being formed, and the contact hole includes a plurality of contact holes being formed,
each of the plurality of lead wiring lines and a corresponding one of the plurality of second metal layers are electrically connected through a corresponding one of the plurality of contact holes,
each of a plurality of terminals including the terminal is formed using a corresponding one of the plurality of second metal layers exposed through the opening of the second resin layer, and the plurality of terminals include a first terminal group and a second terminal group,
the first terminal group is a terminal group that some terminals of the plurality of terminals electrically connected to some lead wiring lines of the plurality of lead wiring lines are disposed in the direction perpendicular to the extension direction of the lead wiring line, the some lead wiring lines being lead wiring lines not adjacent to each other,
the second terminal group is a terminal group that terminals other than the some terminals of the plurality of terminals electrically connected to the some lead wiring lines of the plurality of lead wiring lines are disposed in the direction perpendicular to the extension direction of the lead wiring line, the some lead wiring lines being lead wiring lines not adjacent to each other,
the protruding portion includes a first protruding portion and a second protruding portion, the first protruding portion and the second protruding portion being formed to extend in the direction perpendicular to the extension direction of the lead wiring line,
the first terminal group shares the first protruding portion, and
the second terminal group shares the second protruding portion.

5. The display device according to claim 1,
wherein the lead wiring line includes a plurality of lead wiring lines being formed, the second metal layer includes a plurality of second metal layers being formed, and the contact hole includes a plurality of contact holes being formed,
each of the plurality of lead wiring lines and a corresponding one of the plurality of second metal layers are electrically connected through a corresponding one of the plurality of contact holes,
each of a plurality of terminals including the terminal is formed using a corresponding one of the plurality of second metal layers exposed through the opening of the second resin layer, and is formed in the direction perpendicular to the extension direction of the lead wiring line, and
the protruding portion is formed into a plurality of protruding portions each having an island shape so that one of the plurality of protruding portions is provided for a corresponding one of the plurality of terminals.

6. The display device according to claim 5,
wherein a surface of each of the plurality of protruding portions each formed to have an island shape is covered by a corresponding one of the plurality of second metal layers.

7. The display device according to claim 5,
wherein the plurality of terminals include a first terminal group and a second terminal group,
the first terminal group is a terminal group that some terminals of the plurality of terminals electrically connected to some lead wiring lines of the plurality of lead wiring lines are disposed in the direction perpendicular to the extension direction of the lead wiring line, the some lead wiring lines being lead wiring lines not adjacent to each other,
the second terminal group is a terminal group that terminals other than the some terminals of the plurality of terminals electrically connected to the some lead wiring lines of the plurality of lead wiring lines are disposed in the direction perpendicular to the extension direction of the lead wiring line, the some lead wiring lines being lead wiring lines not adjacent to each other,
the protruding portion is formed into a plurality of protruding portions each having an island shape so that one of the plurality of protruding portions is provided for a corresponding one of the plurality of terminals of the first terminal group and the second terminal group, and
in the direction perpendicular to the extension direction of the lead wiring line, an interval between adjacent ones of the plurality of second metal layers is larger than an interval between adjacent ones of the plurality of protruding portions.

8. The display device according to claim 5,
wherein an inorganic layered film including the first inorganic layer and the second inorganic layer is formed in the frame region,
a third slit formed is formed in the frame region, the third slit being formed by removing at least a part of the inorganic layered film, and the third slit is formed between adjacent ones of the plurality of protruding portions each having an island shape.

9. The display device according to claim 1, wherein the substrate is a flexible substrate,
an inorganic layered film including the first inorganic layer and the second inorganic layer is formed in the frame region,
a bending slit is formed from one end portion of the flexible substrate to another end portion of the flexible substrate in the direction perpendicular to the extension direction of the lead wiring line, the bending slit being formed by removing at least a part of the inorganic layered film,
the bending slit is filled by a same material as the third resin layer,
a first slit is formed between the bending slit and the terminal, the first slit being formed by removing at least a part of the inorganic layered film,
the lead wiring line is electrically connected to a first conductive member being formed using a same material as the second metal layer,
the first conductive member intersects the bending slit being filled by the same material as the third resin layer, and
the lead wiring line intersects the first slit, and is formed in a layer lower than the first slit.

10. The display device according to claim 9, wherein the first slit is formed from the one end portion of the flexible substrate to the another end portion of the flexible substrate in the direction perpendicular to the extension direction of the lead wiring line.

11. The display device according to claim 9, wherein the lead wiring line includes a plurality of lead wiring lines being formed, the second metal layer includes a plurality of second metal layers being formed, and the contact hole includes a plurality of contact holes being formed,
each of the plurality of lead wiring lines and a corresponding one of the plurality of second metal layers are electrically connected through a corresponding one of the plurality of contact holes,
the first slit is formed into a plurality of first slits each having an island shape so that one of the plurality of first slits is provided for a corresponding one of the plurality of lead wiring lines,
each of the plurality of lead wiring lines intersects a corresponding one of the plurality of first slits each having an island shape,
the plurality of first slits each having an island shape include a first slit group and a second slit group,
the first slit group is a slit group that some first slits of the plurality of first slits each having an island shape intersecting some lead wiring lines of the plurality of lead wiring lines are disposed in the direction perpendicular to the extension direction of the lead wiring line, the some lead wiring lines being lead wiring lines not adjacent to each other, and
the second slit group is a slit group that some first slits other than the some first slits of the plurality of first slits each having an island shape intersecting the some lead wiring lines of the plurality of lead wiring lines are disposed in the direction perpendicular to the extension direction of the lead wiring line, the some lead wiring lines being lead wiring lines not adjacent to each other.

12. The display device according to claim 9, wherein the first slit is covered by the second resin layer.

13. The display device according to claim 9, wherein the lead wiring line overlapping the first slit is covered by a second conductive member being formed using the same material as the second metal layer and being formed into an island shape.

14. The display device according to claim 13, wherein the first slit and the second conductive member are covered by the second resin layer.

15. The display device according to claim 1, wherein the substrate is a flexible substrate,
an inorganic layered film including the first inorganic layer and the second inorganic layer is formed in the frame region,
a bending slit is formed from one end portion of the flexible substrate to another end portion of the flexible substrate in the direction perpendicular to the extension direction of the lead wiring line, the bending slit being formed by removing at least a part of the inorganic layered film,
a first slit is formed between the bending slit and the terminal, the first slit being formed by removing at least a part of the inorganic layered film,
the bending slit and the first slit are filled by a same material as the third resin layer,
the lead wiring line is electrically connected to a first conductive member being formed using a same material as the second metal layer,
the first conductive member intersects the bending slit being filled by the same material as the third resin layer, and
the second metal layer intersects the first slit filled by the same material as the third resin layer.

16. The display device according to claim 9, wherein a second slit is formed in the frame region, the second slit being formed by removing at least a part of the inorganic layered film, and
the terminal is disposed between the first slit and the second slit in the direction perpendicular to the extension direction of the lead wiring line.

17. The display device according to claim 1, wherein the first resin layer and the second resin layer are formed using a same material.

18. The display device according to claim 1, wherein the third resin layer is formed in a part of the TFT layer between the second metal layer and the first resin layer.

19. A manufacturing method for a display device including a substrate, a display element defining a display region being provided above the substrate so that the display element and the substrate interpose a TFT layer, a frame region being provided around the display region, and a terminal being provided at an end portion of the frame region and being configured to input a signal from outside, the manufacturing method comprising the steps of:
forming the TFT layer, the forming the TFT layer including forming a first inorganic layer, forming a first metal layer, forming a second inorganic layer, forming a second metal layer, and forming a first resin layer;
forming a second resin layer; and
forming a third resin layer,
wherein, in the forming of the first inorganic layer, the first inorganic layer is formed on the substrate,
in the forming of the first metal layer, a lead wiring line being configured to transmit the signal from the terminal to a signal line in the display region is formed on the first inorganic layer in a part of the frame region between the display region and the terminal, in the forming of the second inorganic layer, the second inorganic layer is formed to cover the lead wiring line, and a contact hole is then formed at a portion of the second inorganic layer to overlap the lead wiring line, in the forming of the third resin layer, a protruding portion is formed on the second inorganic layer, in the forming of the second metal layer, the second metal layer is formed to overlap the protruding portion and to be electrically connected to the lead wiring line through the contact hole, and in the forming of the second resin layer, an opening is formed at a position at which the protruding portion and the second metal layer overlap each other.

\* \* \* \* \*